US009418577B2

(12) United States Patent
Kim et al.

(10) Patent No.: US 9,418,577 B2
(45) Date of Patent: Aug. 16, 2016

(54) POLYESTER-BASED METALIZING FILM

(75) Inventors: Dong Jin Kim, Gumi-si (KR); Si Min Kim, Daegu (KR); Yun Jo Kim, Gumi-si (KR); Il Chon Kwon, Daegu (KR)

(73) Assignee: KOLON INDUSTRIES, INC., Gwacheon-si (KR)

( * ) Notice: Subject to any disclaimer, the term of this patent is extended or adjusted under 35 U.S.C. 154(b) by 55 days.

(21) Appl. No.: 14/005,744

(22) PCT Filed: Mar. 19, 2012

(86) PCT No.: PCT/KR2012/001940
§ 371 (c)(1),
(2), (4) Date: Oct. 21, 2013

(87) PCT Pub. No.: WO2012/128517
PCT Pub. Date: Sep. 27, 2012

(65) Prior Publication Data
US 2014/0065333 A1    Mar. 6, 2014

(30) Foreign Application Priority Data

Mar. 18, 2011  (KR) .................. 10-2011-0024455
Mar. 18, 2011  (KR) .................. 10-2011-0024487
Mar. 18, 2011  (KR) .................. 10-2011-0024510

(51) Int. Cl.
*G09F 3/00* (2006.01)
*G09F 3/04* (2006.01)
(Continued)

(52) U.S. Cl.
CPC .............. *G09F 3/0291* (2013.01); *C23C 14/20* (2013.01); *G09F 3/04* (2013.01); *G09F 23/06* (2013.01); *Y10T 428/1328* (2015.01); *Y10T 428/24868* (2015.01); *Y10T 428/24884* (2015.01); *Y10T 428/24917* (2015.01)

(58) Field of Classification Search
CPC ......... G09F 3/0291; G09F 23/06; G09F 3/04; C23C 14/20; Y10T 428/24868; Y10T 428/1328; Y10T 428/24884; Y10T 428/24917
USPC ................................ 428/34.9, 209, 203, 205
See application file for complete search history.

(56) References Cited

U.S. PATENT DOCUMENTS

2007/0087191 A1*  4/2007  Kaya et al. .............. 428/343
2009/0110888 A1*  4/2009  Wuest et al. ............. 428/200
2010/0051200 A1*  3/2010  Mueller et al. .......... 156/344
(Continued)

FOREIGN PATENT DOCUMENTS

JP    61-90505 U      6/1986
JP    2003-225962 A   8/2003
(Continued)

OTHER PUBLICATIONS

Korean Intellectual Property Office, Communication dated Feb. 26, 2014, issued in corresponding Korean Application No. 10-2011-0024510.
International Searching Authority International Search Report of PCT/KR2012/001940 dated Oct. 10, 2012.

*Primary Examiner* — Gwendolyn Blackwell
*Assistant Examiner* — Kevin Ortman, Jr.
(74) *Attorney, Agent, or Firm* — Sughrue Mion, PLLC

(57) ABSTRACT

The present invention relates to a metalizing film including a polyester-based film layer having a heat-shrinking property, and a use of the metalizing film used as a film label capable of replacing a paper label attached to a glass bottle.

21 Claims, 1 Drawing Sheet

(51) Int. Cl.
*G09F 23/06* (2006.01)
*C23C 14/20* (2006.01)

(56) References Cited

U.S. PATENT DOCUMENTS

2010/0112263 A1* 5/2010 Lorence et al. ............. 428/41.8
2011/0172386 A1  7/2011 Kim
2014/0087107 A1* 3/2014 Kim et al. ................... 428/35.7

FOREIGN PATENT DOCUMENTS

| JP | 2007253461 A | * | 10/2007 | ............ B32B 27/36 |
| KR | 10-2002-0089584 A | | 11/2002 | |
| KR | 10-2006-0078530 A | | 7/2006 | |
| KR | 10-2009-0061574 A | | 6/2009 | |
| WO | WO 2009/066928 A2 | * | 5/2009 | ................ C08J 5/18 |

* cited by examiner

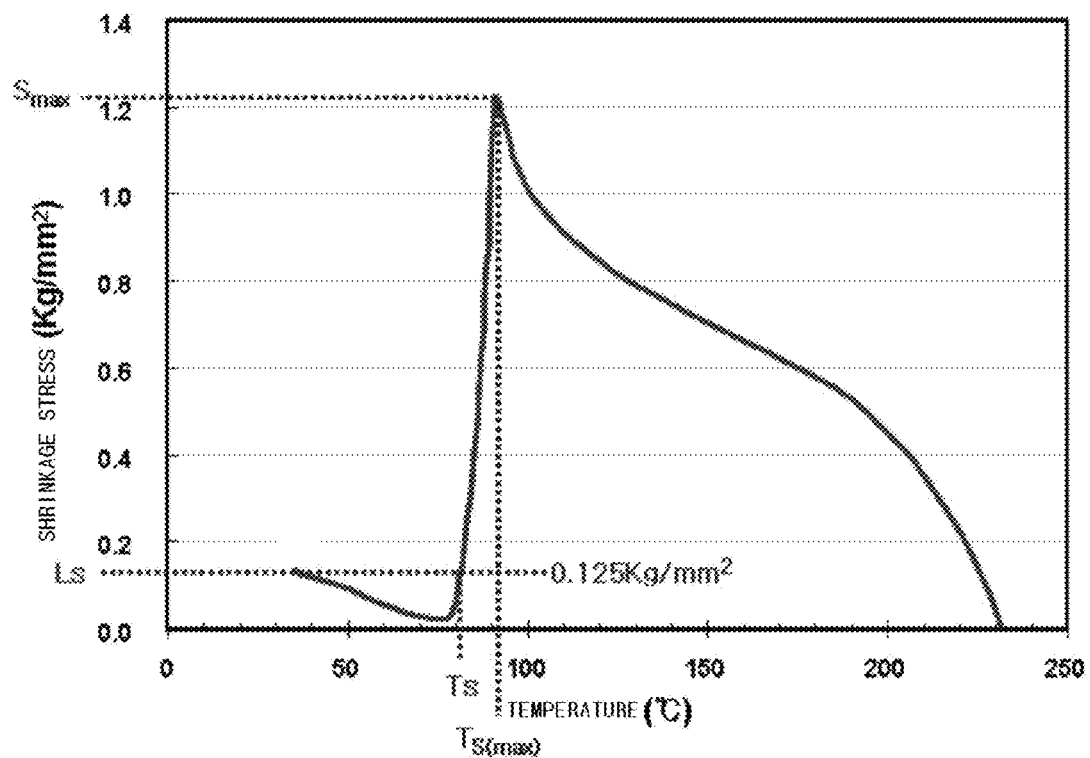

POLYESTER-BASED METALIZING FILM

CROSS REFERENCE TO RELATED APPLICATIONS

This is a National Stage of International Application No. PCT/KR2012/001940 filed Mar. 19, 2012, claiming priority based on Korean Patent Application Nos. 10-2011-0024455 filed Mar. 18, 2011, 10-2011-0024487 filed Mar. 18, 2011 and 10-2011-0024510 filed Mar. 18, 2011, the contents of all of which are incorporated herein by reference in their entirety.

TECHNICAL FIELD

The present invention relates to a metalizing film including a polyester-based film layer having a heat-shrinking property, and to the uses of the metalizing film used as a film label capable of replacing a paper label attached to a glass bottle.

BACKGROUND ART

In consideration of environmental requirements and economical efficiency, a polyethylene terephthalate (PET) bottle or a glass bottle has been collected and then recycled. At the time of recycling the PET or glass bottle, a label on which product names, ingredients, other figures, or the like, are printed and attached to the PET or glass bottle except for a body of the PET or glass bottle should be separated and removed. In the case of a paper label that has been mainly used up to now, the paper label has been removed using industrial water. More specifically, the collected PET bottle or glass bottle is immersed in industrial water containing caustic soda at about 80° C., thereby removing the label. Therefore, environmental waste water is generated in recycling an empty bottle, and accordingly, environmental regulations have intensified.

Therefore, a demand for a label made of a film material rather than the paper label has increased.

Meanwhile, as an example of a film capable of being used as a label, there is a poly vinyl chloride-based film, but this film is not preferable since the film cause an environmental problem such as generation of dioxin at the time of incineration, or the like. Therefore, a polyester-based heat-shrinkable film has been prominent as a means capable of replacing the paper label.

As a method of using the polyester-based heat shrinkable film as the label, a method of using a sticker form, a method of performing printing on the film as in an existing paper label to attach the printed film using an aqueous adhesive, or the like, may be considered.

As the method of attaching the label using an adhesive as the paper label, a method of separating and transferring each sheet of labels mounted on a labeler of an absorption form, applying the adhesive onto a back surface of the label using a gravure printing method, and then attaching the label to a vessel transferred by a conveyer-belt has been generally used. However, in the case of the polyester-based heat-shrinkable film label on which a print layer is formed, a rolling phenomenon of the label itself may be severe, such that it may be difficult to easily utilize a process of attaching the paper label according to the related art.

In addition, in a glass bottle colored for UV-blocking, or the like, such as a beer bottle, or the like, a printing effect of a general label may be insufficient, and in the case in which the label is made of a film material, there is a problem in increasing an advertisement effect of using this label.

DISCLOSURE

Technical Problem

An object of the present invention is to provide a polyester-based metalizing film capable of implementing a vivid deposition color at the time of being used as a label and improving an advertisement effect while maintaining shrinkability.

Another object of the present invention is to provide an eco-friendly bottle capable of increasing an advertisement effect by attaching a label including the polyester-based metalizing film as described above thereto and capable of preventing generation of waste water by removing the label using only hot water at the time of recycling the bottle.

Still another object of the present invention is to provide a method of manufacturing a label attached bottle capable of transferring a label and applying an adhesive onto an anti-curling layer may be performed in a single process in spite of using a film label.

Technical Solution

In one general aspect, a polyester-based metalizing film includes: a heat-shrinkable polyester-based film base; a metal deposition layer formed on the base; a print layer formed on the metal deposition layer; and an anti-curling layer formed on the other surface of the base.

The polyester-based metalizing film may further include a protective layer formed on the print layer.

The polyester-based metalizing film may further include a primer layer formed between the metal deposition layer and the print layer.

A curl characteristic value defined in a detailed description may be 5.0 mm or less.

The polyester-based metalizing film may further include a back metal deposition layer between the base and the anti-curling layer.

The polyester-based metalizing film may have opacity (%) of 80% or more.

The metal deposition layer may have an optical density of 1.0 to 3.0, and the back metal deposition layer may have an optical density of 0.2 to 0.8.

The anti-curling layer may be an embossing layer formed by physically or chemically treating a surface of the heat-shrinkable polyester-based film base or a white pigment coating layer.

The anti-curling layer may be a layer made of a composition containing at least one resin selected from a polyamide resin, an acrylic resin, a polyurethane resin, a polyvinyl chloride (PVC)-based resin, a ketone resin, chlorinated rubber, a vinyl acetate resin, and an ethylene-vinyl acetate copolymer; at least one solvent selected from an aromatic hydrocarbon-based solvent, a ketone-based solvent, an acetate-based solvent, a chlorine-based solvent; and a white pigment and at least one additive selected from an anti-precipitator, a thickening agent, a color-separation preventing agent, a pigment dispersant.

The protective layer may be a resin layer made of any one selected from copolyester, an acrylic copolymer, a styrene copolymer, a methacrylate copolymer, polystyrene, vinyl acetate, polyamide, alkylacrylate, ureaformaldehyde, epoxydized soybean oil, an ethylene-vinyl acetate copolymer, beef tallow-based oleamide, polyethylene glycol distearate, polyvinylidene, a polyolefin-based copolymer, a urethane resin, and a vinyl-based resin, or a mixture thereof.

The heat-shrinkable polyester-based film base may contain a polyester-based resin including a butylene terephthalate repeating unit.

The heat-shrinkable polyester-based film base may contain at least one copolyester selected from copolyesters obtained from a dicarboxylic acid component including at least one dicarboxylic acid such as terephthalic acid, oxalic acid, malonic acid, succinic acid, adipic acid, suberic acid, azelaic acid, sebacic acid, phthalic acid, isophthalic acid, naphthalene dicarboxylic acid, diphenyl ether carboxylic acid, and a diol component including at least one diol such as ethylene glycol, neopentyl glycol, propylene glycol, trimethylene glycol, tetramethylene glycol, hexamethylene glycol, diethylene glycol, polyalkylene glycol, 1,4-cyclohexane dimethanol.

In the copolyester, a ratio of a terephthalic acid monomer among the dicarboxylic acid monomers may be 80 mole % or more, and a ratio of other monomers except for ethylene glycol among the diol monomers may be 12 to 24 mole %.

The heat-shrinkable polyester-based film base may be a uniaxially oriented heat-shrinkable polyester film base or a biaxially oriented heat-shrinkable polyester film base.

In the case in which it is treated with hot water at 90° C. for 10 seconds, a shrinkage rate in a maximum shrinkage direction may be 40 to 80%.

A initial shrinkage temperature in a maximum shrinkage direction may be 68 to 94° C., a maximum shrinkage temperature may be 80 to 110° C., and a maximum shrinkage stress may be 0.60 to 1.80 kg/mm$^2$.

The polyester-based metalizing film may have a total transmittance of 0.01 to 5.0%.

The heat-shrinkable polyester-based film base may have a haze of 0.3 to 10.0%.

In another general aspect, a label-attached bottle includes the polyester-based metalizing film as described above.

The polyester-based metalizing film may be removed by immersing the bottle in hot water.

In another general aspect, a method of manufacturing a label-attached bottle includes: applying an adhesive onto a coating layer of the polyester-based metalizing film as described above; and attaching a heat-shrinkable polyester metalizing film onto which the adhesive is applied to a vessel.

Advantageous Effects

The polyester-based metalizing film according to the exemplary embodiment of the present invention may implement vivid deposition colors while maintaining shrinkability to thereby improve the advertisement effect. In addition, since the polyester-based metalizing film has suitable opacity, even though the print label, which is the final product, is applied to a colored bottle, a color of the bottle is not reflected, such that a printing effect may be excellent, visibility of the printed pattern may be increased, thereby increasing an aesthetic property of the advertisement. At the time of using the polyester-based metalizing film instead of the existing paper label, transferring of a label and application of an adhesive to a bottle may be performed in a single process line, such that the existing process line for a paper label may be used as it is. Further, at the time of recycling the bottle, since the label may be removed using only hot water, generation of waste water may be prevented, such that the label using polyester-based metalizing film may be eco-friendly.

DESCRIPTION OF DRAWINGS

FIG. 1 is a graph obtained by observing a shrinkage stress value change of a polyester-based metalizing film obtained in Example 1 in a maximum shrinkage direction according to the temperature change using a thermal stress tester.

BEST MODE

A polyester-based metalizing film according to an exemplary embodiment of the present invention includes: a heat-shrinkable polyester-based film base; a metal deposition layer formed on the base; a protective layer formed on a print layer; and an anti-curling layer formed on the other surface of the base.

A polyester-based metalizing film according to another exemplary embodiment of the present invention includes: a heat-shrinkable polyester-based film base; a metal deposition layer formed on the base; a print layer formed on the metal deposition layer; a protective layer formed on the print layer; and an anti-curling layer formed on the other surface of the base.

A polyester-based metalizing film according to another exemplary embodiment of the present invention includes: a heat-shrinkable polyester-based film base; a metal deposition layer formed on the base; a print layer formed on the metal deposition layer; a primer layer formed on the print layer; a protective layer formed on the primer layer; and an anti-curling layer formed on the other surface of the base.

A polyester-based metalizing film according to another exemplary embodiment of the present invention includes: a heat-shrinkable polyester-based film base; a metal deposition layer formed on the base; a print layer formed on the metal deposition layer; a back metal deposition layer formed on the other surface of the base, and an anti-curling layer formed on the back metal deposition layer.

A polyester-based metalizing film according to another exemplary embodiment of the present invention includes: a heat-shrinkable polyester-based film base; a metal deposition layer formed on the base; a print layer formed on the metal deposition layer; a protective layer formed on the print layer; a back metal deposition layer formed on the other surface of the base; and an anti-curling layer formed on the back metal deposition layer.

A polyester-based metalizing film according to another exemplary embodiment of the present invention includes: a heat-shrinkable polyester-based film base; a metal deposition layer formed on the base; a primer layer formed on the metal deposition layer; a print layer formed on the primer layer; a protective layer formed on the print layer; a back metal deposition layer formed on the other surface of the base; and an anti-curling layer formed on the back metal deposition layer.

The embodiments are provided in order to describe the present invention in more detail, but the present invention is not limited thereto.

As used herein, the term "heat-shrinkable polyester-based film base" may be considered as a film base containing a polyester-based resin as a main matrix configuring a film and manufactured according to the principle that the maximum uniaxial or biaxial orientation is formed by low-temperature uniaxial or biaxial stretching, the oriented molecular chain keeps residual stress as it is by excluding a releasing process of the residual stress through heat treatment, and the film base is shrunk by the residual stress force in a final shrinkage process. That is, the heat-shrinkable polyester-based film base includes a biaxially oriented shrinkable film as well as a uniaxially oriented shrinkable film.

A composition of the heat-shrinkable polyester-based film base as described above is not particularly limited. For example, the heat-shrinkable polyester-based film base may be made of at least one copolyester selected from copolyesters obtained from dicarboxylic acid component including at least one dicarboxylic acid known in the art such as terephthalic acid, oxalic acid, malonic acid, succinic acid, adipic acid, suberic acid, azelaic acid, sebacic acid, phthalic acid, isophthalic acid, naphthalene dicarboxylic acid, diphenyl ether carboxylic acid, or the like and a diol component including at least one diol known in the art such as ethylene glycol, neopentyl glycol, propylene glycol, trimethylene glycol, tetramethylene glycol, hexamethylene glycol, diethylene glycol, polyalkylene glycol, 1,4-cyclohexane dimethanol, or the like; or a mixture of a homopolyester and the copolyester.

The copolyester itself may be prepared by a general method for preparing polyester. For example, a direct esterification method of directly reacting diol with dicarboxylic acid, a transesterification method of allowing diol to act on dimethylester of dicarboxylic acid, or the like, may be used.

In this case, the copolyester may be a copolyester in which a ratio of a terephthalic acid monomer among the dicarboxylic acid monomers is 80 mole % or more, and a ratio of other monomers except for ethylene glycol among the diol monomers is 12 to 24 mole % or more. In the copolyester, the monomers except for the ethylene glycol monomer serve to deteriorate crystallinity of a polyester polymer to increase a shrinkage rate. It may be advantageous in view of controlling a drying process, film processability, and controlling melting property and physical properties during a manufacturing process of the film that a ratio of the corresponding monomer is within the above-mentioned range.

In the present invention, the copolyester itself may be prepared by a general method for preparing polyester. For example, a direct esterification method of directly reacting diol with dicarboxylic acid, a transesterification method of allowing diol to act on dimethylester of dicarboxylic acid, or the like, may be used.

According to the embodiment of the present invention, the copolyester has a melting point CC) of 190 to 220° C. and an inherent viscosity of 0.60 to 0.75 dl/g. In this case, the melting point (° C.) may be controlled according to the composition of the monomers used to prepare the polymer, and the inherent viscosity may be changed according to the polymerization degree. In the present invention, the copolyester having the melting point (° C.) and the inherent viscosity within the above-mentioned ranges may be used by controlling the composition of the monomers and the polymerization degree as described above.

Meanwhile, as the homopolyester, polytriethylene terephthalate may be used instead of polybutylene terephthalate or be used together with polybutylene terephthalate.

In manufacturing the heat-shrinkable polyester-based film base, in order to improve a slip property, a lubricant such as silicon dioxide, titanium dioxide, silica powder, calcium carbonate, or the like, may be added, and various additives such as an antistatic agent, an anti-aging agent, a UV blocker, a pigment may be added, as needed.

Meanwhile, the heat-shrinkable polyester-based film base needs to be manufactured as a film roll by rolling or winding a long film at a high speed in view of improving productivity in a film forming process or post-processing process. In this case, the heat-shrinkable polyester-based film base may include an in-line coating layer containing the antistatic agent on a surface layer.

As used herein, the term "in-line coating layer" may be considered by those skilled in the art as a layer formed by performing a coating process in any one process of processes for extruding a polyester resin to form a film.

In the case in which the in-line coating layer containing the antistatic agent is formed on the surface layer of the film as described above, a phenomenon that films stick to each other during the winding process of the film roll may be removed by reducing static electricity generated by friction, which may be advantageous in that air introduced during the winding process of the film roll may be easily discharged. In addition, a printing defect by static electricity caused by friction between a printing roll and the film during a printing process is prevented, and a phenomenon that the films stick to each other by static electricity during the post-processing process is removed, thereby making it possible to control a feeding defect.

A kind of antistatic agent is not particularly limited. An example thereof may include a quaternary ammonium compound, an alkyl sulfonate compound represented as $RSO_3Na$, an alkyl sulfate compound represented by $ROSO_3Na$, an alkyl phosphate compound, or the like. A content of the antistatic agent is 0.1 to 1.5 weight % based on active ingredients in a solution for forming the in-line coating layer, which may be preferable in that an amount of foreign materials generated by friction during the printing process, a tubing process, and a heat-shrinking process may be minimized to thereby obtain excellent processability and antistatic performance.

Meanwhile, the in-line coating layer may contain a binder resin in consideration of binding force and adhesion force. In this case, the binder resin is not particularly limited, but may be selected in consideration of solubility in a solvent during the tubing process.

A considerable example of the binder resin may include a polyester-based resin, an acryl-polyester copolymer, copolyester-based resin, and the like.

In view of implementing vivid deposition colors at the time of forming the metal deposition layer, it is preferable that the heat-shrinkable polyester-based film base has a haze of 0.3 to 10.0%.

A thickness of the heat-shrinkable polyester-based film base is not particularly limited, but may be generally 35 to 65 μm, preferably 40 to 60 μm, which may be advantageous in view of satisfying a stiffness and implementing feeding stability of a label and uniformity of attachment of the label to a bottle when a final product obtained by completing deposition and printing is attached to the bottle.

As described above, the embodiment of the present invention may also include the biaxially oriented shrinkable film as well as uniaxially oriented shrinkable film, but is not limited thereto. However, the biaxially oriented shrinkable film may be advantageous in that a curling phenomenon may be further reduced during a process of manufacturing the label, attaching the label to the bottle, or the like, and then detaching the label from the bottle.

Meanwhile, the polyester-based metalizing film according to the present invention includes the metal deposition layer formed on the heat-shrinkable polyester-based film base. In addition, the polyester-based metalizing film may further include the back metal deposition layer formed on the other surface of the base, as needed. The metal deposition layer positioned on the surface of the metalizing film according to the present invention is a layer for increasing an advertisement effect at the time of forming the print layer, and the back metal deposition layer on the other surface has a function of preventing warpage of the metalizing film.

It is preferable that the polyester-based metalizing film includes the metal deposition layers on both surfaces of the base and a curl characteristic value defined as described below is 5 mm.

Considering this point, in the case in which the anti-curling layer is a coating layer containing a solvent such as the white pigment coating layer, a curl characteristic value as defined below may be preferably 5 mm or less.

Curl Characteristic Value:

A heat-shrinkable polyester metalizing film subjected to various processing processes was put on a flat glass plate, and the film was cut in a transverse direction at a length of 20 cm without damage using a cutter while putting a ruler on the metalizing film, thereby forming a first cutting line. Then, the film was cut again in a machine direction (a direction perpendicular to the first cutting line) at a length of 20 cm based on a central point of the first cutting line without damage using the ruler and the cutter, thereby forming a second cutting line. Thereafter, four cutting lines having a distance of 10 cm from a crossing point between the first and second cutting lines in the transverse and machine directions were formed, respectively. In order to confirm that the cutting was completed with respect to the metalizing film having the 4 cutting lines in the transverse and machine directions, a cutting state was confirmed by raising the metalizing film in a vertical direction. The metalizing film was put on the flat glass plate again, and a vertical height of an edge portion lifted from a flat surface to thereby warp upwardly was measured at each of the four edges corresponding to crossing points of the cutting lines. In this case, after measurement is performed on the case in which the deposition layer is set as an upper surface and the case in which the deposition layer is set as a lower surface, respectively, a value indicating the maximum height is defined as a "curl characteristic value". A negative value among the curl characteristic values is defined as a vertical height in a direction opposite to the vertical height of the portion warped upwardly.

In the case in which the curl characteristic value defined as described above is 5 mm or less, an adhesion process may be easily performed at the time of applying the metalizing film according to the embodiment of the present invention as the label.

Preferably, the curl characteristic value may be 2 mm or less.

According to the preferable embodiment, in order to satisfy the curl characteristic value as described above, thicknesses of the metal deposition layers formed on both surfaces may be controlled.

As an example, a metal deposition layer is formed on one surface of the base so as to have a thickness allowing an optical density to be 1.0 to 3.0. Hereinafter, this metal deposition layer positioned on the surface will be referred to as a "surface metal deposition layer". In view of stability of a deposition process and implementation of a shielding effect, it is advantageous that a thickness of the surface metal deposition layer is 20 to 90 nm, preferably, 40 to 70 nm.

A metal deposition layer is formed on the other surface of the base so as to have a thickness allowing an optical density to be 0.2 to 0.8. Hereinafter, this metal deposition layer positioned on the back surface of the base will be referred to as a "back metal deposition layer". In view of maintaining flatness of the label, it is preferable that a thickness of the back metal deposition layer is 5 to 25 nm, preferably 10 to 20 nm.

An example of a metal used in the surface or back metal deposition layer may include Al, Zn, Mg, Sn, Ti, In, Cr, Ni, Cu, Pb, and Fe. Among them, Al, Zn, and Mg may be preferable, and particularly, Al may be most preferable in view of productivity.

In view of stability of the deposition process and implementation of a shielding effect, it is advantageous that the thickness of the metal deposition layer is 20 to 90 nm, preferably, 40 to 70 nm.

Even though a method of forming the metal deposition layer is not particularly limited, a physical deposition method such as a vacuum deposition method, a sputtering method, an ion plating method, or the like, or a chemical deposition method such as a chemical vapor deposition (CVD) method, or the like, may be used.

As described above, in the case in which the metal deposition layer is formed on the heat-shrinkable polyester-based base film, in order to implement vivid deposition colors, the heat-shrinkable polyester-based base film may be preferably transparent. When the metal deposition layer is formed on this transparent base, it seems that light is blocked due to a reflective effect by the metal deposition layer, but substantially, there is a limitation in preventing reflection with only the metal deposition layer.

Considering this point, the metalizing film according to the exemplary embodiment of the present invention may have opacity of 80% or more, preferably 90 to 100%. In this case, a color of a bottle is not reflected, such that a printing effect may be excellent, visibility of the printed patterns may be increased, thereby increasing an aesthetic property of the advertisement.

Considering this point, the polyester-based metalizing film according to the exemplary embodiment of the present invention includes the print layer formed on the metal deposition layer.

The print layer on which items associated with the contents filled in a vessel, advertisements, and warnings are printed as letters or figures serves to promote a product. As a method of forming the print layer as described above, a method known in the art may be used. For example, a gravure printing method, a flexo printing method, a screen printing method, or the like, may be used. In view of performing a function as a print layer and preventing the print layer from being broken, it is preferable that a thickness of the print layer is of 0.5 to 10 μm.

As needed, the primer layer may be further included between the metal deposition layer and the print layer. The primer layer may increase adhesive strength between the metal deposition layer and the print layer to impart scratch resistance to the print layer and serve to prevent contamination generation by separation of the print layer during a bottle washing process for removing the label from the bottle. The primer layer as described above may be appropriately selected in consideration of the print layer, but is not limited thereto. The primer layer as described above may be appropriately selected in consideration of the print layer, but is not limited thereto.

Further, in order to obtain the adhesive strength, before the metal deposition layer is formed, the surface of the heat-shrinkable polyester-based film base may be subjected to corona treatment, flame treatment, plasma treatment, glow discharge treatment, surface roughening treatment, or the like.

In addition, the protective layer may be further formed on the print layer, which is to impart weather resistance or durability to the metal deposition layer in addition to protecting the print layer. A composition of the protective layer is not particularly limited. For example, the protective layer may be a resin layer made of any one selected from copolyester, an acrylic copolymer, a styrene copolymer, a methacrylate copolymer, polystyrene, vinyl acetate, polyamide, alkylacrylate, ureaformaldehyde, epoxydized soybean oil, an ethylene-vinyl acetate copolymer, beef tallow-based oleamide, polyethylene glycol distearate, polyvinylidene, a polyolefin-based copolymer, a urethane resin, and a vinyl-based resin, or a mixture thereof.

In view of coating stability of the protective layer and stability of the drying process, it may be advantageous that the protective layer has a thickness of 0.1 to 5.0 µm, preferably 0.3 to 1.0 µm.

Further, in order to use the polyester-based metalizing film according to the present invention as a label, after applying an adhesive on a back surface of the label, the label is attached to the vessel. In this case, in order to facilitate the adhesion process, the label should be flat, the adhesive may be easily dried, and a suitable shielding property should be satisfied.

Therefore, the polyester-based metalizing film includes the anti-curling layer formed on the other surface of the heat-shrinkable polyester-based film base.

The anti-curling layer may be an embossing layer formed by physically or chemically treating the surface of the heat-shrinkable polyester-based film base or a white pigment coating layer.

In the case in which the embossing layer is formed by physically or chemically treating the surface of the heat-shrinkable polyester-based film base, when the adhesive is applied onto the metalizing film and the metalizing film is attached to the bottle and then dried, drying efficiency may be improved and a drying time may be reduced due to an air layer formed in the embossing layer.

The anti-curling layer may be a separate coating layer rather than the embossing layer as described above. More specifically, the anti-curling layer may be the white pigment coating layer. In the case of forming the white pigment coating layer, the shielding property of the metalizing film may be improved, and a micro embossing effect by surface roughness may be obtained, such that the drying efficiency of the adhesive applied onto the film may be improved and the drying time thereof may be reduced.

Meanwhile, in an example of the known method of attaching a paper label, particularly, a sheet of the paper label to a glass bottle, or the like, after separating a label including a print layer formed thereon and having a predetermined gauge from a labeler in an absorption scheme, a process of applying an adhesive onto a back surface of the label using a gravure printing method, and then attaching the label to a vessel transferred by a conveyer-belt is continuously performed (this is referred to as an "on-line adhesion process"). In the case of the paper label, suitable flatness may be maintained even after the print layer is formed, but in the case of the heat-shrinkable polyester-based film, when the print layer is formed on one surface of the base, the curling phenomenon of the film may become severe due to a solvent for diluting the pigment. Therefore, it may be difficult to apply the film label in bottle manufacturers, liquor manufacturers using the paper label according to the related art, and the like.

Considering this difficulty, the anti-curling layer may be a layer made of a composition containing at least one resin selected from resins such as a polyamide resin, a polyvinyl chloride (PVC)-based resin, a ketone resin, chlorinated rubber, an acrylic resin, a polyurethane resin, an ethylene-vinyl acetate copolymer, a vinyl-based resin; at least one solvent selected from an aromatic hydrocarbon-based solvent, a ketone-based solvent, an acetate-based solvent, a chlorine-based solvent; and a white pigment and additives such as an anti-precipitator, a thickening agent, a color-separation preventing agent, a pigment dispersant, or the like.

When the anti-curling layer is made of this composition on the other surface of the base film, a suitable shielding property may be exhibited and the curling phenomenon of the heat-shrinkable polyester-based film base may be easily controlled.

In view of coating stability of the anti-curling layer, stability of the drying process, and prevention of the warpage phenomenon of the label by the solvent, it is preferable that the anti-curling layer as described above has a thickness of 0.1 to 5.0 µm, preferably 0.4 to 2.0 µm.

Meanwhile, it is preferable that in the metalizing film according to the exemplary embodiment of the present invention including the anti-curling layer as described above, the curl characteristic value as defined below is 5.0 mm or less.

Curl Characteristic Value:

A heat-shrinkable polyester metalizing film subjected to various processing processes was put on a flat glass plate, and the film was cut in a transverse direction at a length of 20 cm without damage using a cutter while putting a ruler on the metalizing film, thereby forming a first cutting line. Then, the film was cut again in a machine direction (a direction perpendicular to the first cutting line) at a length of 20 cm based on a central point of the first cutting line without damage using the ruler and the cutter, thereby forming a second cutting line. Thereafter, four cutting lines having a distance of 10 cm from a crossing point between the first and second cutting lines in the transverse and machine directions were formed, respectively. In order to confirm that the cutting was completed with respect to the metalizing film having the 4 cutting lines therein in the transverse and machine directions, a cutting state was confirmed by raising the metalizing film in a vertical direction. The metalizing film was put on the flat glass plate again, and a vertical height of an edge portion lifted from a flat surface to thereby be warped upwardly was measured at each of the four edges corresponding to crossing points of the cutting lines. In this case, after measurement is performed on the case in which the deposition layer is set as an upper surface and the case in which the deposition layer is set as a lower surface, respectively, a value indicating the maximum height is defined as a "curl characteristic value".

In the case in which the curl characteristic value defined as described above is 3 mm or less, the adhesion process may be easily performed at the time of applying the metalizing film according to the embodiment of the present invention as the label.

When the polyester-based metalizing films according to the embodiments of the present invention satisfying the above-mentioned configurations is treated with hot water at 90° C. for 10 seconds, a shrinkage rate in the maximum shrinkage direction may be 40 to 80%.

The hot water shrinkage rate range as described above may be advantageous in view of facilitating separation and allowing the shrinkable film separated from the bottle and falling into the bottle to be curled and easily discharged in a process of separating a label using hot water at the time of recovering an empty bottle to recycle the recovered bottle after attaching the heat-shrinkable film to a bottle, or the like, as a label using the adhesive.

More specifically, in the case of treating the polyester-based metalizing film with hot water at 90° C. for seconds, when the shrinkage rate in the maximum shrinkage direction is less than 40%, a time required for shrinkage is increased, and shrinkage stress generated at the time of shrinkage may become weak, such that the label may not be separated from the vessel. Therefore, when the polyester-based metalizing film is used as a label, separation efficiency at the time of removing the label in order to recycle the bottle may be decreased, and an additional process for removing an unseparated label is required, such that energy cost may be increased. On the other hand, when the shrinkage rate in the maximum shrinkage direction is more than 80%, in order to improve the shrinkage rate in manufacturing the base film, since a stretching rate in the transverse direction needs to be increased, the metalizing film may be frequently ruptured, such that a yield at the time of forming the base film may be rapidly decreased, and it may be difficult to maintain economic efficiency. In addition, since the curling phenomenon of the film becomes severe due to an excessively high shrinkage speed of the base film, a label may fall inside an empty bottle while the label is separated and removed from the bottle in a washing process, but it may be difficult to discharge the label from the bottle, thereby causing a problem in the separating and removing process.

Further, in the case in which the polyester-based metalizing film has a initial shrinkage temperature of 68 to 94° C. in the maximum shrinkage direction, when the polyester-based film is used as the label, at the time of removing the label for recycling the bottle, the label may be easily removed with a short time. Here, the initial shrinkage temperature may be defined as follows.

Initial shrinkage temperature: An initial temperature at which shrinkage stress is equal to that of an initial load in a graph obtained by fixing the film at room temperature under a predetermined initial load and then measuring stress at the time of shrinkage of the film while heating at a predetermined heating rate to indicate the shrinkage stress according to the temperature as a graph.

As an example of a measuring device capable of implementing the graph as described above, there is a thermal stress tester.

For example, in order to confirm a heat-shrinking property of the metalizing film according to the temperature change using the thermal stress tester, firstly, after the film is fixed under the predetermined load, stress changes by shrinkage according to the temperature change are measured while applying heat at the predetermined heating rate.

An example of the measurement graph by the above-mentioned method is shown in FIG. 1. Referring to FIG. 1, an initial point indicates an initially set load value Ls. When the temperature is raised, initially, the film is softened, such that the stress value is decreased as compared to the initial load Ls, but when the temperature arrives at a predetermined temperature, the film starts to shrink while becoming tense. At this time, a shrinkage stress value equal to the initial load Ls is observed, and this temperature is defined as a initial shrinkage temperature Ts.

In the heat-shrinkable polyester-based film according to the present invention, the initial shrinkage temperature as described above in the maximum shrinkage direction is 68 to 94° C. In the case in which the initial shrinkage temperature is lower than 68° C., the label may be partially separated from the bottle during a distributing and storing process of a final product in summer, which may have a negative influence on the appearance of the final product, and in the case in which the initial shrinkage temperature is higher than 94° C., at the time of a label removing process in hot water, a high temperature and a long period of the time are required, thereby increasing process cost.

In addition, a maximum shrinkage temperature of the polyester-based metalizing film in the maximum shrinkage direction according to the present invention is observed in a range of 80 to 110° C. Here, the maximum shrinkage temperature may be defined as an initial temperature at which the maximum shrinkage stress value is shown in a graph obtained by fixing the film at room temperature under a predetermined initial load and then measuring stress at the time of shrinkage of the film while heating at a predetermined heating rate to indicate the shrinkage stress according to the temperature as a graph.

Further, a shrinkage stress value at this time is defined as the maximum shrinkage stress, and the value may be 0.60 to 1.80 kg/mm$^2$.

Referring to the graph of the shrinkage stress value change according to the temperature change obtained by using a thermal stress tester as shown in FIG. 1, when the shrinkable film starts to shrink, a curve of the shrinkage stress value ascends up to a predetermined temperature, and the curve of the shrinkage stress value descends over a temperature T(Smax) at which the maximum shrinkage stress value Smax is shown.

Here, when the temperature T(Smax) at which the maximum shrinkage stress value Smax is shown is high, at the time of performing hot water treatment for removing the label, a high temperature or a long period of time is required.

In this regard, in the polyester-based metalizing film according to the present invention, the maximum shrinkage temperature in a main shrinkage direction may be 80 to 110° C., and it is advantageous that the maximum shrinkage temperature is low. Further, in view of separation force of the label, it is advantageous that the maximum shrinkage stress is 0.60 to 1.80 kg/mm$^2$.

In addition, total transmittance of the polyester-based metalizing film according to the present invention may be preferably 0.01 to 5.0% in order to protect materials in a container from the light and increase a printing effect by the shielding property.

A method of manufacturing the polyester-based metalizing films according to the embodiments of the present invention is not particularly limited. For example, a metal deposition layer may be formed by vacuum depositing a metal such as aluminum or the like, on one surface of a heat-shrinkable polyester film base. Then, a print layer is formed on the metal deposition layer. In this case, the print layer may be formed, for example, by 5-times printing using a gravure type printer. Meanwhile, in view of improving scratch resistance of the print layer and preventing the print layer from being separated from the metal deposition layer, the print layer may be formed, for example, after additionally coating a composition for forming the above-mentioned protective layer using the gravure type printer on the print layer or forming the protective layer on the metal deposition layer. In addition, the anti-curling layer may be formed on the other surface of the heat-shrinkable polyester film base using the above-mentioned solution for forming anti-curling layer.

At the time of metal deposition on one surface of a polyester film having heat-shrinking property, generally, a deposition may be performed at 1200° C. or more at which metal may be vaporized, and a degree of vacuum in the chamber in which the deposition is performed may be maintained preferably at 10$^{-2}$ torr or more. As a deposition method, a general device may be used, and a method known in the art using a crucible type device, a boat type device, or the like, may be used.

As a device for forming the print layer, a general device may be used. For example, the print layer may be formed by a method known in the art such as a gravure printing method, a flexo printing method, or the like.

The polyester-based metalizing films according to the embodiments of the present invention may be useful as the label replacing the paper label. According to the embodiment of the present invention, there is provided a bottle on which a label including the polyester-based metalizing film as described above is attached.

As a method of attaching the label including the polyester-based metalizing film to a glass bottle, or the like, a method of attaching a paper label according to the related art may be used. However, as an adhesive, a water soluble adhesive may be used in consideration of a film material and environmental aspects. In the case of applying the water soluble adhesive onto a coating surface of the polyester-based metalizing film label transferred as a single-sheet form of the label and attaching the adhesive applied surface to the bottle transferred by a conveyer belt, the bottle to which the polyester-based metalizing film label as the single-sheet form of the label is attached may be manufactured.

In recovering and recycling the label-attached bottle manufactured as described above, removal of the polyester-based metalizing film is performed by immersing the bottle in hot water. In this case, a temperature of the hot water may be sufficient at about 70 to 90° C.

Hereinafter, Examples of the present invention will be described in detail, but the scope of the present invention is not limited to Examples.

Evaluation methods used in the present invention are as follows.

(1) Heat Shrinkage Rate

A film base and a metalizing film each were cut into a rectangle having a size of 15 mm (MD)×400 mm (TD) in a maximum shrinkage direction (TD: transverse direction) and a direction (MD: machine direction) perpendicular thereto, and a sample having an effective measuring distance of 300 mm was manufactured by drawing full lines in the MD direction at points spaced from both ends by 50 mm in the TD direction. Then, the sample was heat-shrunk for 10 seconds in a state of catching a point within 50 mm from any one end of the sample in the TD direction using tweezers, or the like, to completely immerse the entire sample in hot water at 90° C.±0.5° C. under no load condition, and the sample was released at room temperature for 1 minute. Thereafter, a length reduced from the interval of 300 mm represented by the initial full lines in the TD direction was measured, and the heat shrinkage rate in the maximum shrinkage direction (TD direction) of the film was calculated according to the following Equation 1.

Heat shrinkage rate (%)=(300 mm−length after shrinkage/300 mm)×100   <Equation 1>

(2) Thickness Measurement

After the film sample was rapidly frozen by being immersed in liquid nitrogen, the film sample was broken in the liquid nitrogen, and a cross section thereof was measured using a scanning electronic microscope (SEM, Jeol Inc. 6700F). In addition, a thickness of each of the layers configuring the film was measured by adjusting magnification and using a scale bar.

Further, after the thickness of each of the film base and the metalizing film was measured by an interval of 5 cm using a thickness gauge with respect to the entire width, an average value of the measured values except for the maximum and minimum values was calculated as the thickness.

(3) Haze

The haze was measured according to ASTM D-1003. After 7 portions were randomly extracted from 2 peripheral portions of a polyester film and a central portion thereof and cut at a size of 5 cm×5 cm, respectively, each cut fraction was put into a haze meter (Nippon Denshoku, NDH 5000) and a measuring method was set according to ASTM. Thereafter, the haze (%) was measured by transmitting light, and an average value of the 5 values except for the maximum and minimum values was calculated as the haze.

(4) Total Transmittance

The total transmittance was measured according to ASTM D-1003. After 7 portions were randomly extracted from 2 peripheral portions of a polyester metalizing film and a central portion thereof and cut at a size of 5 cm×5 cm, respectively, each cut fraction was put into a haze meter (Nippon Denshoku, NDH 5000) and a measuring method was set according to ASTM. Thereafter, the total transmittance (%) was measured by mounting the sample so as to allow light to be incident onto a metal deposition layer and to be transmitted toward an anti-curling layer, and an average value of the 5 values except for the maximum and minimum values was calculated as the total transmittance.

(5) Opacity

The opacity was measured according to ASTM D-1003. After 7 portions were randomly extracted from 2 peripheral portions of a polyester metalizing film and a central portion thereof and cut at a size of 5 cm×5 cm, respectively, each cut fraction was put into a film opacity meter (Series 6000) and a measuring method was set according to ASTM. Thereafter, the opacity (%) was measured by mounting the sample so as to allow light to be incident onto a metal deposition layer and to be transmitted toward an anti-curling layer, and an average value of the 5 values except for the maximum and minimum values was calculated as the opacity (%).

(6) Initial Shrinkage Temperature, Maximum Shrinkage Temperature, and Maximum Shrinkage Stress The principle applied to analyzing a initial shrinkage temperature, a maximum shrinkage temperature, and maximum shrinkage stress of the polyester-based metalizing film according to the present invention in a maximum shrinkage direction, and the initial shrinkage temperature, the maximum shrinkage temperature, and the maximum shrinkage stress derived therefrom will be defined as follows.

1) Principle

A polymer chain is oriented and crystallized during a stretching process and has a structure divided into a crystalline region and an amorphous region. When the stretched polymer is heated, a relaxation phenomenon of stress remaining the polymer chain and a shrinkage phenomenon of returning to its original shape may occur. Force inhibiting the shrinkage as described above is called shrinkage stress, and the higher the shrinkage stress, the higher the shrinkage force according to the temperature under the same conditions.

After fixing a film at room temperature under a predetermined initial load, when the film is heated at a predetermined heating rate, stress changes by expansion and shrinkage of the sample according to the temperature change may be derived by a detection method of using a linear variable differential transformer (LVDT). Information on the shrinkage stress of the film according to the temperature change may be obtained using this principle. In this case, since the heating rate depends on a residual stress relaxation rate of the polymer chain, in the present invention, the shrinkage stress value according to the temperature change was measured at a heating rate of 2.5° C./sec.

A graph of the measured values shows a pattern as shown in FIG. 1. Here, a temperature at which a shrinkage stress value equal to an initial load value Ls is initially observed is defined as a initial shrinkage temperature Ts, a temperature at which a value corresponding to a peak of the graph appears is defined as a maximum shrinkage temperature T(Smax), and a stress value at T(Smax) is defined as a maximum shrinkage stress Smax. As an example of a device implementing the principle as described above, a thermal stress tester (KE-2, Kanebo Eng.) was used in the following Examples and Comparative Examples.

After a film sample having a width of 4 mm (MD direction) and a length of 50 mm (TD direction) was fixed under an initial load of 0.125 kg/mm$^2$ using the thermal stress tester (KE-2, Kanebo Eng.), shrinkage stress according to the temperature was measured while heating at a heating rate of 2.5° C./sec, thereby obtaining a graph.

In this graph, a temperature at which a shrinkage stress value equal to the initial load of 0.125 kg/mm² was initially observed was defined as a initial shrinkage temperature Ts, a temperature at which a maximum shrinkage stress value initially appeared was defined as a maximum shrinkage temperature T(Smax), and a stress value at T(Smax) was defined as a maximum shrinkage stress Smax.

(7) Deposition Label Visibility Evaluation

After a water soluble adhesive prepared by mixing 45 parts by weight of styrene-butadiene rubber latex, 40 parts by weight of acrylic emulsion, 10 parts by weight of ethylene-vinyl emulsion, 0.8 parts by weight of sodium hydroxide, 0.1 parts by weight of a sterilizer, and 4.1 parts by weight of water was applied at a thickness of 5 μm onto a colored square glass plate (S01, S09, S16, S24, Dae Dong Glass) having a width of 10 cm and a length of 10 cm, a deposition label was attached so that an anti-curling layer of the deposition label was positioned on the glass plate onto which the adhesive was applied. Then, the entire deposition label was rubbed by reciprocating a rubber roller 10 times at a pressure of 3 kg/cm² so that the deposition label was firmly attached to the glass plate.

The manufactured sample was displayed in a general product display state and observed by 10 persons, and then whether or not the printing of the deposition label was vivid regardless of the color of the glass plate was determined.

The sample of which the printing was evaluated as vivid by over eight persons was determined as good (○), the sample of which the printing was evaluated as vivid by over six persons was determined as fair (Δ), and the sample of which the printing was evaluated as vivid by less than six persons was determined as poor (x).

(8) Printing Adhesion Property Evaluation

After the polyester-based metalizing film subjected to various processing processes was cut into a rectangle having a size of 15 cm (MD)×5 cm (TD) in a transverse direction (TD) and a machine direction (MD), a transparent tape (Nitto Tape, 31-B) having a predetermined adhesion force was attached to a print layer of the cut film so as not to generate air bubbles, and the entire cut film was rubbed by reciprocating a rubber roller 10 times at a pressure of 3 kg/cm² so that the transparent tape was firmly attached to the polyester-based metalizing film, thereby completely adhering the transparent tape thereto.

After 10 samples were manufactured by the above-mentioned method, the transparent tape attached to the print layer was separated therefrom, and the number of samples in which the printing on the polyester-based metalizing film was separated was measured, thereby evaluating the samples as good, fair, poor, respectively.

The case in which the measured number was 0 was evaluated as good (○), the case in which the measured number was 1 or more was evaluated as fair (Δ), and the case in which the measured number was 3 or more was evaluated as poor (x).

(9) Label Adhesion Property Evaluation during Manufacturing Process of Bottle.

After a polyester-based metalizing film label was cut into a square having a size of 80 mm×80 mm in a maximum shrinkage direction and a direction perpendicular thereto, a water soluble adhesive prepared by mixing 45 parts by weight of styrene-butadiene rubber latex, 40 parts by weight of acrylic emulsion, 10 parts by weight of ethylene-vinyl emulsion, 0.8 parts by weight of sodium hydroxide, 0.1 parts by weight of a sterilizer, and 4.1 parts by weight of water was applied onto an anti-curling layer of a polyester-based metalizing film label at a thickness of 5 μm using a gravure printing method, and labeling was performed on 1000 glass bottles (soju bottle) using a labeler. After the labeled 1000 glass bottles were released at room temperature for 2 days, the number of bottles on which the label was wrinkled or an edge of the label was separated was measured, such that the adhesion property was evaluated by obtaining an adhesive failure rate according to the following Equation 2.

$$\text{Adhesive failure rate}(\%) = \frac{\text{The number of bottles in which the label was wrinkled or an edge of the label was separated}(ea)}{1000(ea)} \times 100 \quad \langle\text{Equation 2}\rangle$$

$$\text{Adhesion property}(\%) = 100 - \text{adhesive failure rate}(\%)$$

(10) Separation Property Evaluation after the Label was Attached to the Bottle

After a water soluble adhesive prepared by mixing 45 parts by weight of styrene-butadiene rubber latex, 40 parts by weight of acrylic emulsion, 10 parts by weight of ethylene-vinyl emulsion, 0.8 parts by weight of sodium hydroxide, 0.1 part by weight of a sterilizer, and 4.1 parts by weight of water was applied at a thickness of 5 μm onto a bottle, a label was attached to the glass bottle so that a print layer of the label was positioned at the outermost surface of the adhesive applied bottle. Then, the entire label was rubbed by reciprocating a rubber roller 10 times at a pressure of 3 kg/cm² so that the label was firmly attached to the glass bottle and released at room temperature for 2 days to solidify the adhesive, thereby completely fixing the label to the glass bottle.

After bottles to which the label normally attached except for the bottles evaluated as label adhesive failure generated bottles were released in hot water at 80° C. for 2 minutes, the number of bottles from which the label was not completely separated was measured, such that the separation property was evaluated by obtaining a separation failure rate according to the following Equation 3.

$$\text{Separation failure rate}(\%) = \frac{\text{The number of bottles from which the label was not completely separated}(ea)}{\text{The number of bottles to which the label was normally attached}(ea)} \times 100 \quad \langle\text{Equation 3}\rangle$$

$$\text{Separation property}(\%) = 100 - \text{separation failure rate}(\%)$$

(11) Process Applicability Evaluation of Label

Process applicability of the label was closely associated with the adhesion and separation properties of the label. In view of process applicability, even though one of the adhesion and separation properties was deteriorated, as a result, process applicability was also deteriorated.

Therefore, the process applicability of the label was evaluated according to the following Equation 4.

$$\text{Process applicability }(\%) = [\text{adhesion property }(\%) \times \text{separation property }(\%)]/100 \quad \langle\text{Equation 4}\rangle$$

(12) Curl Characteristic Value

A polyester-based metalizing film subjected to various processing processes was put on a polished glass plate having a refractive index of 1.567, and the film was cut in a transverse direction at a length of 20 cm without damage using a cutter and a ruler on the metalizing film, thereby forming a first cutting line. Then, the film was cut again in a machine direction (a direction perpendicular to the first cutting line) at a length of 20 cm based on a central point of the first cutting line without damage using the ruler and the cutter, thereby forming a second cutting line. Thereafter, four cutting lines having a distance of 10 cm from a crossing point between the first and second cutting lines in the transverse and machine directions were formed, respectively. In order to confirm that the cutting was completed with respect to the metalizing film having the 4 cutting lines in the transverse and machine directions, a cutting state was confirmed by raising the metalizing film in a vertical direction. The metalizing film was put on the flat glass plate again, and a vertical height of an edge portion lifted from a flat surface to thereby be warped upwardly was measured at each of the four edges corresponding to crossing points of the cutting lines. Here, after measurement was performed on the case in which the deposition layer is set as an upper surface and the case in which the deposition layer is set as a lower surface, respectively, a value indicating the maximum height was defined as a "curl characteristic value". A negative value among the curl characteristic values is defined as a vertical height in a direction opposite to the vertical height of the portion flexibly raised.

Hereinafter, the present invention will be described in detail with reference to Examples, but the present invention is not limited thereto.

Example 1

Polycondensation was performed by a direct esterification method using 100 mole % of terephthalic acid as a dibasic acid component, 100 mole % of ethylene glycol and 24 mole % of neopentyl glycol as glycol components, and antimony trioxide (0.05 mole based on an acid component) as a catalyst. Silicon dioxide powder (500 ppm) having an average particle size of 2.7 μm was added to the obtained polymer and dried by a method according to the related art, thereby obtaining copolyester having an inherent viscosity of 0.71 dl/g and a melting point of 203° C.

Meanwhile, a polybutylene terephthalate resin (inherent viscosity: 0.97 dl/g, melting point: 220° C.) was obtained using 100 mole % of terephthalic acid and 100 mole % of 1,4-butadiol by injecting 0.015 parts by weight of tetrabutyl titanate as a catalyst.

90 weight % of the copolyester and 10 weight % of polybutylene terephthalate were blended with each other and extruded using an extruder at 270° C., followed by rapid cooling and solidification, thereby obtaining an unstretched film. The unstretched film passed through a roller transferred in a machine direction and a preheating section at 85° C. and was stretched 4.2 times at 72° C. in a transverse direction. Then, the stretched film passed through a heat treating section at room temperature, thereby manufacturing a polyester-based heat-shrinkable film having a thickness of 50 μm. The obtained film had a thickness of 50 μm, and a heat shrinkage rate and a haze measured by the methods as described above were 77.2% (TD direction) and 5.1%, respectively.

A metal (aluminum) deposition layer (thickness: 53 nm) having an optical density of 2.1 was formed on the obtained polyester-based heat-shrinkable film by evaporating aluminum having a purity of 99.9% using a crucible type evaporator under conditions at which a degree of vacuum at an upper portion of the evaporator was 1.09×10$^{-4}$ mbar, a degree of vacuum at a lower portion was 2.23×10$^{-2}$ mbar, evaporation was performed at a crucible temperature of 1400° C., a cooling roll temperature was −16° C., and a deposition rate was 400 m/min.

A print layer having a thickness of 2.2 μm was formed on the metal deposition layer from five kinds of solutions containing 10 weight % of an acrylic resin (BPS-5698, Samyoung Toyo), 80 weight % of methylethylketone (MEK, Daesin Chemicals) as a ketone-based solvent, and 10 weight % of one pigment selected from a yellow pigment (Yellow 10G, Hyundai Chemical), a red pigment (RED-FRN™, Hyundai Chemical), a green pigment (GREEN 735™, Hyundai Chemical), a black pigment (BLACK #30™, Hyundai Chemical), and a white pigment (R-100™, KPI) to have the entire content of 100 weight % by 5-times printing using a gravure roll.

A protective layer having a thickness of 0.3 μm was formed on the print layer from a solution containing alcohol (E'VANOL™ 70-75, Dupont) and polyamide (MO-5336™, Motochem) to have the entire content of 100 weight % by 1-times printing after controlling a depth of a gravure roll.

Meanwhile, an anti-curling layer having a thickness of 1.1 μm was formed from a solution containing 10 weight % of the acrylic resin (BPS-5698™, Samyoung Toyo), 89 weight % of methylethylketone (MEK™, Daesin Chemicals) as the ketone-based solvent, and 1 weight % of the white pigment (R-100™, KPI) to have the entire content of 100 weight % by 2-times printing after controlling a depth of a gravure roll, thereby manufacturing a metalizing film according to the present invention.

The obtained metalizing film was evaluated by the above-mentioned methods, and the results were shown in the following Tables 1 and 2.

Example 2

A metalizing film having the same structure as that in Example 1 was manufactured, but at the time of manufacturing a base film, polycondensation was performed by a direct esterification method using 100 mole % of terephthalic acid as a dibasic acid component, 106 mole % of ethylene glycol and 18 mole % of neopentyl glycol as glycol components, and antimony trioxide (0.05 mole based on an acid component) as a catalyst. Silicon dioxide powder (500 ppm) having an average particle size of 2.7 μm was added to the obtained polymer and dried by a method according to the related art, thereby obtaining copolyester having an inherent viscosity of 0.63 dl/g and a melting point of 218° C.

90 weight % of the copolyester and 10 weight % of polybutylene terephthalate of Example 1 were blended with each other and extruded using an extruder at 270° C., followed by rapid cooling, thereby obtaining a solidified unstretched film. The unstretched film passed through a roller transferred in a machine direction and a preheating section at 92° C. and was stretched 4.0 times at 72° C. in a transverse direction. Then, the stretched film passed through a heat treating section at 90° C., thereby manufacturing a polyester-based heat-shrinkable film having a thickness of 60 μm.

A metal deposition layer was formed on the manufactured polyester-based heat-shrinkable film under the same conditions as those in Example 1, thereby manufacturing a metalizing film including a metal deposition layer having a thickness of 53 nm, a print layer having a thickness of 2.2 μm, a protective layer having a thickness of 0.3 μm, and an anti-curling layer having a thickness of 1.1 μm.

Example 3

A metalizing film having the same structure as that in Example 1 was manufactured, but at the time of manufacturing a base film, polycondensation was performed by a direct esterification method using 100 mole % of terephthalic acid as a dibasic acid component, 96 mole % of ethylene glycol and 28 mole % of neopentyl glycol as glycol components, and antimony trioxide (0.05 mole based on an acid component) as a catalyst. Silicon dioxide powder (50 ppm) having an average particle size of 2.7 μm was added to the obtained polymer and dried by a method according to the related art, thereby obtaining copolyester having an inherent viscosity of 0.73 dl/g and a melting point of 193° C.

90 weight % of the copolyester and 10 weight % of polybutylene terephthalate of Example 1 were blended with each other and extruded using an extruder at 270° C., followed by rapid cooling, thereby obtaining a solidified unstretched film. The unstretched film passed through a roller transferred in a machine direction and a preheating section at 82° C. and was stretched 4.0 times at 70° C. in a transverse direction. Then, the stretched film passed through a heat treating section at room temperature, thereby manufacturing a polyester-based heat-shrinkable film having a thickness of 40 μm.

A metal deposition layer was formed on the manufactured polyester-based heat-shrinkable film under the same conditions as those in Example 1, thereby manufacturing a metalizing film including a metal deposition layer having a thickness of 53 nm, a print layer having a thickness of 2.2 μm, a protective layer having a thickness of 0.3 μm, and an anti-curling layer having a thickness of 1.1 μm.

The obtained metalizing film was evaluated by the above-mentioned methods, and the results were shown in the following Tables 1 and 2.

Example 4

A metalizing film having the same structure as that in Example 1 was manufactured, but at the time of manufacturing a base film, polycondensation was performed by a direct esterification method using 100 mole % of terephthalic acid as a dibasic acid component, 80 mole % of ethylene glycol and 20 mole % of 1,4-cyclohexane dimethanol as glycol components, and antimony trioxide (0.05 mole based on an acid component) as a catalyst. Silicon dioxide powder (500 ppm) having an average particle size of 2.7 μm was added to the obtained polymer and dried by a method according to the related art, thereby preparing copolyester having an inherent viscosity of 0.68 dl/g and a melting point of 205° C.

The copolyester was extruded at 270° C. using an extruder, followed by rapid cooling and solidification, thereby obtaining an unstretched film. The unstretched film passed through a roller transferred in a machine direction and a preheating section at 85° C. and was stretched 4.2 times at 72° C. in a transverse direction. Then, the stretched film passed through a heat treating section at room temperature, thereby manufacturing a heat-shrinkable film having a thickness of 50 μm.

A metal deposition layer was formed on the manufactured polyester-based heat-shrinkable film under the same conditions as those in Example 1, thereby manufacturing a metalizing film including a metal deposition layer having a thickness of 53 nm, a print layer having a thickness of 2.2 μm, a protective layer having a thickness of 0.3 μm, and an anti-curling layer having a thickness of 1.1 μm.

The obtained metalizing film was evaluated by the above-mentioned methods, and the results were shown in the following Tables 1 and 2.

Example 5

A metalizing film having the same structure as that in Example 1 was manufactured, but a metal (aluminum) deposition layer (thickness: 41 nm) having an optical density of 1.8 was formed on the polyester-based heat-shrinkable film base by evaporating aluminum having a purity of 99.9% using a crucible type evaporator under conditions at which a degree of vacuum at an upper portion of the evaporator was $1.41 \times 10^{-4}$ mbar, a degree of vacuum at a lower portion was $2.01 \times 10^{-2}$ mbar, evaporation was performed at a crucible temperature of 1400° C., a cooling roll temperature was −16° C., and a deposition rate was 450 m/min.

A metal deposition layer was formed on the manufactured polyester-based heat-shrinkable film under the same conditions as those in Example 1, thereby manufacturing a metalizing film including a metal deposition layer having a thickness of 41 nm, a print layer having a thickness of 2.2 μm, a protective layer having a thickness of 0.3 μm, and an anti-curling layer having a thickness of 1.1 μm.

The obtained metalizing film was evaluated by the above-mentioned methods, and the results were shown in the following Tables 1 and 2.

Example 6

A metalizing film having the same structure as that in Example 1 was manufactured, but a metal (aluminum) deposition layer (thickness: 66 nm) having an optical density of 2.0 was formed on the polyester-based heat-shrinkable film base by evaporating aluminum having a purity of 99.9% using a crucible type evaporator under conditions at which a degree of vacuum at an upper portion of the evaporator was $1.97 \times 10^{-4}$ mbar, a degree of vacuum at a lower portion was $2.16 \times 10^{-2}$ mbar, evaporation was performed at a crucible temperature of 1400° C., a cooling roll temperature was −20° C., and a deposition rate was 330 m/min.

The same processes as those in Example 1 were performed on the manufactured polyester-based heat-shrinkable film under the same conditions as those in Example 1, thereby manufacturing a metalizing film including the metal deposition layer having a thickness of 66 nm, a print layer having a thickness of 2.0 μm, a protective layer having a thickness of 0.4 μm, and an anti-curling layer having a thickness of 1.0 μm.

The obtained metalizing film was evaluated by the above-mentioned methods, and the results were shown in the following Table 1.

Example 7

A metalizing film having the same structure as that in Example 1 was manufactured, but a primer layer was formed on the metal deposition layer before forming a print layer.

More specifically, the primer layer having a thickness of 0.4 μm was formed on the metal deposition layer using a gravure roll from a silane coupling agent (3-glycidoxypropyltrimethoxy silane) diluted with methylethylketone at a concentration of 0.5 weight %, thereby manufacturing a metalizing film including the metal deposition layer having a thickness of 53 nm, a print layer having a thickness of 2.2 μm, a protective layer having a thickness of 0.3 μm, and an anti-curling layer having a thickness of 1.1 μm.

The obtained metalizing film was evaluated by the above-mentioned methods, and the results were shown in the following Table 1.

Example 8

A metalizing film having the same structure as that in Example 1 was manufactured, but a primer layer was formed on the metal deposition layer before forming a print layer.

More specifically, the primer layer having a thickness of 0.4 μm was formed on the metal deposition layer using a gravure roll from a coating solution prepared by diluting a mixed varnish composed of 10 weight % of urethane (urethane varnish) and 90 weight % of vinyl chloride (vinyl chloride varnish) with methylethylketone so as to have a solid content of 25%, thereby manufacturing a metalizing film including the metal deposition layer having a thickness of 53 nm, a print layer having a thickness of 2.2 μm, a protective layer having a thickness of 0.3 μm, and an anti-curling layer having a thickness of 1.1 μm.

The obtained metalizing film was evaluated by the above-mentioned methods, and the results were shown in the following Table 1.

Example 9

A metalizing film having the same structure as that in Example 1 was manufactured by the same method as in Example 1 except that a print layer (thickness: 1.2 μm) was formed on the metal deposition layer from four kinds of solutions containing 10 weight % of an acrylic resin (BPS-5698™, Samyoung Toyo), 80 weight % of methylethylketone (MEK™, Daesin Chemicals) as a ketone-based solvent, and 10 weight % of one pigment selected from a yellow pigment (YELLOW 10G™, Hyundai Chemical), a red pigment (RED-FRN™, Hyundai Chemical), a green pigment (GREEN 735™, Hyundai Chemical), a black pigment (BLACK #30™, Hyundai Chemical), and a white pigment (R-100™, KPI) to have the entire content of 100 weight % by 4-times printing using a gravure roll, thereby manufacturing a metalizing film including the metal deposition layer having a thickness of 53 nm, the print layer having a thickness of 1.2 μm, a protective layer having a thickness of 0.3 μm, and an anti-curling layer having a thickness of 1.1 μm.

The obtained metalizing film was evaluated by the above-mentioned methods, and the results were shown in the following Table 1.

Example 10

A metalizing film having the same structure as that in Example 1 was manufactured by the same method as in Example 1 except that a print layer (thickness: 7.5 μm) was formed on the metal deposition layer from eight kinds of solutions containing 10 weight % of an acrylic resin (BPS-5698™, Samyoung Toyo), 80 weight % of methylethylketone (MEK™, Daesin Chemicals) as a ketone-based solvent, and 10 weight % of one pigment selected from a yellow pigment (YELLOW 10G™, Hyundai Chemical), a red pigment (RED-FRN™, Hyundai Chemical), a green pigment (GREEN 735™, Hyundai Chemical), a black pigment (BLACK #30™, Hyundai Chemical), and a white pigment (R-100™, KPI) to have the entire content of 100 weight % by 8-times printing using a gravure roll, thereby manufacturing a metalizing film including the metal deposition layer having a thickness of 53 nm, the print layer having a thickness of 7.5 μm, a protective layer having a thickness of 0.3 μm, and an anti-curling layer having a thickness of 1.1 μm.

The obtained metalizing film was evaluated by the above-mentioned methods, and the results were shown in the following Table 1.

Example 11

A metalizing film having the same structure as that in Example 1 was manufactured by the same method as in Example 1 except that a protective layer (thickness: 1.0 μm) was formed on a print layer using a gravure roll from a solution prepared by diluting a copolyester resin (a copolyester resin prepared by mixing at least two kinds of polyol and polybasic acids and having a number average molecular weight of 5000) with methylethylketone (MEK) so as to have a solid content of 25%, thereby manufacturing a metalizing film including a metal deposition layer having a thickness of 53 nm, the print layer having a thickness of 2.2 μm, a protective layer having a thickness of 1.0 μm, and an anti-curling layer having a thickness of 1.1 μm.

The obtained metalizing film was evaluated by the above-mentioned methods, and the results were shown in the following Table 1.

Example 12

A metalizing film having the same structure as that in Example 1 was manufactured by the same method as in Example 1 except that a protective layer (thickness: 0.4 μm) was formed on a print layer using a gravure roll from a solution prepared by diluting a polyolefin copolymer varnish with methylethylketone (MEK) so as to have a solid content of 25 weight %, thereby manufacturing a metalizing film including a metal deposition layer having a thickness of 53 nm, the print layer having a thickness of 2.2 μm, a protective layer having a thickness of 0.3 μm, and an anti-curling layer having a thickness of 1.1 μm.

The obtained metalizing film was evaluated by the above-mentioned methods, and the results were shown in the following Table 1.

Example 13

A metalizing film including a metal deposition layer having a thickness of 53 nm, a print layer having a thickness of 2.2 μm, a protective layer having a thickness of 0.3 μm, and an anti-curling layer having a thickness of 1.1 μm was manufactured by the same method as in Example 1 except that a biaxial heat-shrinkable polyester film having a shrinkage rate of 37.5% in a machine direction (MD) of the film, a shrinkage rate of 75.2% in a transverse direction (TD), and a thickness of 50 μm was manufactured by passing a unstretched film obtained by the same method in Example 1 through a preheating section at 65° C., stretching the preheated film 1.6 times at 70° C. in the machine direction of the film, passing the stretched film through a cooling roll at room temperature to cool the film at the time of passing the film through a roller group transferred in the machine direction, and then continuously stretching the film using a tenter in the transverse direction under the same conditions as those in Example 1.

The obtained metalizing film was evaluated by the above-mentioned methods, and the results were shown in the following Table 1.

Example 14

A metalizing film including a metal deposition layer having a thickness of 53 nm, a print layer having a thickness of 2.2 μm, a protective layer having a thickness of 0.3 μm, and an anti-curling layer having a thickness of 1.1 μm was manufactured by the same method as in Example 13 except that a biaxial heat-shrinkable polyester film having a shrinkage rate of 41.7% in a machine direction (MD) of the film, a shrinkage rate of 71.3% in a transverse direction (TD), and a thickness of 50 μm was manufactured by passing a unstretched film of Example 13 through a preheating section at 75° C., stretching the preheated film 2.0 times at 75° C. in the machine direction of the film, passing the stretched film through a cooling roll at room temperature to cool the film at the time of passing the film through a roller group transferred in the machine direction, and then continuously stretching the film using a tenter in the transverse direction under the same conditions as those in Example 1.

The obtained metalizing film was evaluated by the above-mentioned methods, and the results were shown in the following Table 1.

Example 15

A metalizing film having the same structure as that in Example 1 was manufactured by the same method as in Example 1 except that a protective layer was not formed, thereby manufacturing a metalizing film including a metal deposition layer having a thickness of 53 nm, a print layer having a thickness of 2.2 μm, and an anti-curling layer having a thickness of 1.1 μm.

The obtained metalizing film was evaluated by the above-mentioned methods, and the results were shown in the following Table 1.

Example 16

Polycondensation was performed by a direct esterification method using 100 mole % of terephthalic acid as a dibasic acid component, 110 mole % of ethylene glycol and 14 mole % of neopentyl glycol as glycol components, and antimony trioxide (0.05 mole based on an acid component) as a catalyst. Silicon dioxide powder (500 ppm) having an average particle size of 2.7 μm was added to the obtained polymer and dried by a method according to the related art, thereby obtaining copolyester having an inherent viscosity of 0.71 dl/g and a melting point of 203° C.

90 weight % of the copolyester and 10 weight % of polybutylene terephthalate of Example 1 were blended with each other and extruded using an extruder at 270° C., followed by rapid cooling and solidification, thereby obtaining an unstretched film. The unstretched film passed through a roller transferred in a machine direction and a preheating section at 92° C. and was stretched 4.0 times at 80° C. in a transverse direction. Then, the stretched film passed through a heat treating section at 95° C., thereby manufacturing a heat-shrinkable film having a thickness of 50 μm.

A metal deposition layer was formed on the manufactured polyester-based heat-shrinkable film under the same conditions as those in Example 1, thereby manufacturing a metalizing film including a metal deposition layer having a thickness of 53 nm, a print layer having a thickness of 2.2 μm, a protective layer having a thickness of 0.3 μm, and an anti-curling layer having a thickness of 1.1 μm.

The metalizing film was evaluated by the above-mentioned methods, and the results were shown in the following Tables 1 and 2.

Comparative Example 1

A metalizing film having the same structure as that in Example 1 was manufactured under the same conditions as those in Example 1 except for using a PET film (50 μm, CI series, Kolon Industries Co.) as a base film, thereby manufacturing a metalizing film including a metal deposition layer having a thickness of 53 nm, a print layer having a thickness of 2.2 μm, a protective layer having a thickness of 0.3 μm, and an anti-curling layer having a thickness of 1.1 μm.

The obtained metalizing film was evaluated by the above-mentioned methods, and the results were shown in the following Tables 1 and 2.

Comparative Example 2

A metalizing film having the same structure as that in Example 1 was manufactured by the same method as in Example 1 except that an anti-curling layer was not formed, thereby manufacturing a metalizing film including a metal deposition layer having a thickness of 53 nm, a print layer having a thickness of 2.2 μm, a protective layer having a thickness of 0.3 μm, and an anti-curling layer having a thickness of 1.1 μm.

The obtained metalizing film was evaluated by the above-mentioned methods, and the results were shown in the following Tables 1 and 2.

Comparative Example 3

A metalizing film having the same structure as that in Example 1 was manufactured, but a metal (aluminum) deposition layer (thickness: 11 nm) having an optical density of 1.6 was formed on the polyester-based heat-shrinkable film base by evaporating aluminum having a purity of 99.9% using a crucible type evaporator under conditions at which a degree of vacuum at an upper portion of the evaporator was $1.87 \times 10^{-4}$ mbar, a degree of vacuum at a lower portion was $2.11 \times 10^{-2}$ mbar, evaporation was performed at a crucible temperature of 1400° C., a cooling roll temperature was −10° C., and a deposition rate was 500 m/min.

The same processes as those in Example 1 were performed on the manufactured polyester-based heat-shrinkable metalizing film under the same conditions as those in Example 1, thereby manufacturing a metalizing film including a metal deposition layer having a thickness of 11 nm, a print layer having a thickness of 2.2 μm, a protective layer having a thickness of 0.3 μm, and an anti-curling layer having a thickness of 1.1 μm.

The obtained metalizing film was evaluated by the above-mentioned methods, and the results were shown in the following Tables 1 and 2.

TABLE 1

| | Base film | Metalizing film | | | | | |
|---|---|---|---|---|---|---|---|
| | Heat shrinkage | | Analysis by thermal stress tester | | | Heat shrinkage | Total |
| | rate (TD direction, %) | Haze (%) | $T_s$ (° C.) | $T_{(S_{max})}$ (° C.) | $S_{max}$ (kg/mm²) | rate (TD direction, %) | transmittance (%) |
| Example 1 | 77.2 | 5.1 | 82.4 | 91.1 | 1.27 | 76.9 | 0.21 |
| Example 2 | 42.9 | 7.9 | 92.6 | 107.6 | 0.60 | 42.1 | 0.16 |

TABLE 1-continued

| | Base film | Metalizing film | | | | |
|---|---|---|---|---|---|---|
| | Heat shrinkage rate (TD direction, %) | Haze (%) | Analysis by thermal stress tester | | | Heat shrinkage rate (TD direction, %) | Total transmittance (%) |
| | | | $T_s$ (°C.) | $T_{(S_{max})}$ (°C.) | $S_{max}$ (kg/mm$^2$) | | |
| Example 3 | 78.5 | 0.5 | 71.4 | 88.3 | 1.59 | 78.2 | 0.22 |
| Example 4 | 77.5 | 4.2 | 89.1 | 98.5 | 0.71 | 76.3 | 0.21 |
| Example 5 | 77.1 | 5.2 | 84.3 | 90.9 | 1.28 | 76.2 | 0.29 |
| Example 6 | 77.3 | 4.8 | 82.7 | 91.2 | 1.26 | 77.1 | 0.11 |
| Example 7 | 77.2 | 4.9 | 83.3 | 91.1 | 1.23 | 77.0 | 0.21 |
| Example 8 | 77.3 | 5.2 | 81.9 | 90.8 | 1.25 | 76.9 | 0.20 |
| Example 9 | 77.4 | 5.0 | 82.7 | 91.1 | 1.25 | 77.1 | 0.20 |
| Example 10 | 77.5 | 5.3 | 82.2 | 91.8 | 1.22 | 77.0 | 0.17 |
| Example 11 | 77.4 | 5.1 | 83.1 | 90.9 | 1.26 | 77.3 | 0.19 |
| Example 12 | 77.3 | 5.2 | 82.2 | 91.5 | 1.24 | 76.8 | 0.21 |
| Example 13 | 75.2 | 5.7 | 84.2 | 92.4 | 1.19 | 74.5 | 0.19 |
| Example 14 | 71.3 | 6.1 | 84.5 | 95.7 | 1.12 | 68.7 | 0.22 |
| Example 15 | 77.4 | 5.2 | 82.2 | 90.9 | 1.23 | 77.1 | 0.21 |
| Example 16 | 77.1 | 5.3 | 82.5 | 91.2 | 1.25 | 76.8 | 0.20 |
| Comparative Example 1 | 1.6 | 87.2 | 230.1 | 271.5 | 0.13 | 1.4 | 0.19 |
| Comparative Example 2 | 77.1 | 5.1 | 82.5 | 91.2 | 1.23 | 76.8 | 9.35 |
| Comparative Example 3 | 77.3 | 5.3 | 82.2 | 90.7 | 1.25 | 77.0 | 11.30 |

TABLE 2

| | Physical properties of metalizing film | | | | | |
|---|---|---|---|---|---|---|
| | Opacity (%) | Printing adhesion property | Visibility evaluation (the number of OK) | Adhesion property of label (%) | Separation property of label (%) | Process applicability of label (%) |
| Example 1 | 98 | ○ | 9 | 99.9 | 99.9 | 99.8 |
| Example 2 | 99 | ○ | 9 | 100.0 | 99.7 | 99.7 |
| Example 3 | 97 | ○ | 8 | 100.0 | 100.0 | 100.0 |
| Example 4 | 99 | ○ | 10 | 99.9 | 99.9 | 99.8 |
| Example 5 | 98 | ○ | 8 | 100.0 | 100.0 | 100.0 |
| Example 6 | 99 | ○ | 9 | 100.0 | 100.0 | 100.0 |
| Example 7 | 97 | ○ | 9 | 100.0 | 100.0 | 100.0 |
| Example 8 | 100 | ○ | 8 | 100.0 | 99.7 | 99.7 |
| Example 9 | 76 | ○ | 9 | 99.7 | 99.9 | 99.6 |
| Example 10 | 97 | ○ | 9 | 99.9 | 100.0 | 99.9 |
| Example 11 | 94 | ○ | 8 | 100.0 | 100.0 | 100.0 |
| Example 12 | 98 | ○ | 8 | 100.0 | 99.9 | 99.9 |
| Example 13 | 98 | ○ | 9 | 100.0 | 99.9 | 99.9 |
| Example 14 | 97 | ○ | 9 | 100.0 | 100.0 | 100.0 |
| Example 15 | 98 | Δ | 8 | 100.0 | 100.0 | 100.0 |
| Example 16 | 97 | ○ | 8 | 99.9 | 85.1 | 85.0 |
| Comparative Example 1 | 99 | ○ | 8 | 99.8 | 2.2 | 2.2 |
| Comparative Example 2 | 74 | ○ | 6 | 87.9 | 99.7 | 87.6 |
| Comparative Example 3 | 68 | ○ | 4 | 86.2 | 99.9 | 86.1 |

It may be appreciated from the results shown in Table 1 and 2 that in the metalizing films of the Examples according to the present invention, the shrinkage stress, the shrinkability, the shielding property, and the printing adhesion property were excellent, and the adhesion property and separation property of the label were high, such that the metalizing films may replace a paper label generally used, and the label may be removed by an eco-friendly means. Particularly, among the Examples, in the case of Examples 13 and 14 in which the stretching was performed in both of the machine direction and the transverse direction of the film, the adhesion property and separation property of the label were excellent, such that the process applicability of the label was excellent, and it may be relatively easy to separate the label peeled off and detached from the bottle and the bottle from each other, as compared to other Examples. Particularly, in a floating type bottle washer of introducing water into the bottle washer to float a label on water surface by using pressure of water and collecting a separated label using a hook at an upper portion of the bottle washer, in the cases of other Examples in which the stretching was performed only in the transverse direction of the film, a label curling phenomenon in the maximum shrinkage direction of the film was generated, such that at the time of floating the label to the upper portion of the bottle washer, pressure or a flux of water needs to be increased, but in the cases of Examples 13 and 14, at the time of separating the label from the bottle, a bidirectional shrinkage phenomenon was generated, which alleviates the label curling phenomenon, such that it may be easy to float the label to the upper portion of the bottle washer to separate the label from the bottle, as compared to other Examples. Therefore, the cases of Examples 13 and 14 were advantageous in view of reduction of water and energy consumption.

On the other hand, it may be appreciated that in the case of Comparative Example 1 in which the heat-shrinkable polyester-based base film was not used, separation of the label in simple hot water was substantially impossible.

Further, in the cases of Comparative Example 2 in which an anti-curling layer was not present and Comparative Example 3 in which the thickness of the metal deposition layer was not controlled, adhesion property of the label was deteriorated due to a warpage phenomenon of the label, and total transmittance of the heat-shrinkable metalizing film was high, such that at the time of applying a print label, which is a final product, to a colored bottle, the color of the bottle may be reflected, which may deteriorate a printing effect and visibility of printed patterns, thereby deteriorating an aesthetic property of the advertisement.

Furthermore, in the case of Example 15 to which the protective layer was not applied, there were no problems in the adhesion property and separation property, but the metal deposition layer and the print layer of the print label were separated from each other at the time of separating the print label, such that the print label separating material may contaminate water, which may cause secondary contamination of the bottle. As a result, additional washing of the bottle should be performed. There was no problem in the entire processability, but since the washing process of the bottle should be added after separating the print label, at the time of applying the print label, process cost may be increased.

Meanwhile, it may be confirmed that in Example 16, the visibility was satisfied and the separation property of the label was suitable, but at the time of removing the print label from the bottle, the print label was attached to the bottle in some cases, such that at the time of removing the print label, several processes should be performed, thereby deteriorating economic efficiency. The reason is due to a high initial shrinkage temperature and low maximum shrinkage stress, and it may be appreciated that in order to optimize the separation property of the label, preferably, the shrinkability need to be controlled.

It may be appreciated from the results shown in Table 2 that in the case of the metalizing film including the metal deposition layer on the heat-shrinkable polyester film base and satisfying predetermined opacity as in Examples according to the present invention, the printing visibility was excellent.

Particularly, in order to have excellent shrinkage stress, shrinkability, total transmittance, printing adhesion property, printing visibility, and the like, so as to be useful as a label and have low adhesion and separation failure rates to thereby replace a generally used paper label, in the metalizing film, the thickness of the anti-curling layer and the shrinkage rate of the base film should be suitably optimized. In addition, it may be confirmed that the case of including the protective layer may be more preferable in view of the printing adhesion property.

Example 17

Polycondensation was performed by a direct esterification method using 100 mole % of terephthalic acid as a dibasic acid component, 100 mole % of ethylene glycol and 24 mole % of neopentyl glycol as glycol components, and antimony trioxide (0.05 mole based on an acid component) as a catalyst. Silicon dioxide powder (500 ppm) having an average particle size of 2.7 μm was added to the obtained polymer and dried by a method according to the related art, thereby obtaining copolyester having an inherent viscosity of 0.71 dl/g and a melting point of 203° C.

Meanwhile, a polybutylene terephthalate resin (inherent viscosity: 0.97 dl/g, melting point: 220° C.) was obtained using 100 mole % of terephthalic acid and 100 mole % of 1,4-butadiol by injecting 0.015 parts by weight of tetrabutyl titanate as a catalyst.

90 weight % of the copolyester and 10 weight % of polybutylene terephthalate were blended with each other and extruded using an extruder at 270° C., followed by rapid cooling and solidification, thereby obtaining an unstretched film. The unstretched film passed through a roller transferred in a machine direction and a preheating section at 85° C. and was stretched 4.2 times at 72° C. in a transverse direction. Then, the stretched film passed through a heat treating section at room temperature, thereby manufacturing a polyester-based heat-shrinkable film having a thickness of 50 μm. The obtained film had a thickness of 50 μm, and a heat shrinkage rate and a haze measured by the methods as described above were 77.3% (TD direction) and 5.2%, respectively.

A metal (aluminum) deposition layer (thickness: 52 nm) having an optical density of 2.1 was formed on the obtained polyester-based heat-shrinkable film by evaporating aluminum having a purity of 99.9% using a crucible type evaporator under conditions at which a degree of vacuum at an upper portion of the evaporator was $1.08 \times 10^{-4}$ mbar, a degree of vacuum at a lower portion was $2.18 \times 10^{-2}$ mbar, evaporation was performed at a crucible temperature of 1400° C., a cooling roll temperature was −16° C., and a deposition rate was 400 m/min.

A metal deposition layer (referred to as a back metal deposition layer, metal: aluminum, thickness: 15 nm) having an optical density of 0.5 was formed on the other surface of the base film by the same method except that the deposition rate was 600 m/min).

A print layer (thickness: 2.0 μm) was formed on the metal deposition layer from five kinds of solutions containing 10 weight % of an acrylic resin (BPS-5698™, Samyoung Toyo), 80 weight % of methylethylketone (MEK™, Daesin Chemicals) as a ketone-based solvent, and 10 weight % of one pigment selected from a yellow pigment (YELLOW 10G™, Hyundai Chemical), a red pigment (RED-FRN™, Hyundai Chemical), a green pigment (GREEN 735™, Hyundai Chemical), a black pigment (BLACK #30™, Hyundai Chemical), and a white pigment (R-100™, KPI) to have the entire content of 100 weight % by 5-times printing using a gravure roll.

A protective layer (thickness: 0.4 μm) was formed on the print layer from a solution containing alcohol (E'VANOL 70-75™, Dupont) and polyamide (MO-5336™, Motochem) to have the entire content of 100 weight % by 1-times printing after controlling a depth of a gravure roll.

Meanwhile, an anti-curling layer having a thickness of 1.0 μm was formed from a solution containing 10 weight % of the acrylic resin (BPS-5698™, Samyoung Toyo), 89 weight % of methylethylketone (MEK™, Daesin Chemicals) as the ketone-based solvent, and 1 weight % of the white pigment (R-100™, KPI) to have the entire content of 100 weight % by 2-times printing after controlling a depth of a gravure roll, thereby manufacturing a metalizing film according to the present invention.

The obtained metalizing film was evaluated by the above-mentioned methods, and the results were shown in the following Tables 3 and 4.

Example 18

A metalizing film having the same structure as that in Example 17 was manufactured, but at the time of manufacturing a base film, polycondensation was performed by a direct esterification method using 100 mole % of terephthalic acid as a dibasic acid component, 106 mole % of ethylene glycol and 18 mole % of neopentyl glycol as glycol components, and antimony trioxide (0.05 mole based on an acid component) as a catalyst. Silicon dioxide powder (500 ppm) having an average particle size of 2.7 μm was added to the obtained polymer and dried by a method according to the related art, thereby obtaining copolyester having an inherent viscosity of 0.63 dl/g and a melting point of 218° C.

90 weight % of the copolyester and 10 weight % of polybutylene terephthalate of Example 17 were blended with each other and extruded using an extruder at 270° C., followed by rapid cooling, thereby obtaining a solidified unstretched film. The unstretched film passed through a roller transferred in a machine direction and a preheating section at 92° C. and was stretched 3.9 times at 72° C. in a transverse direction. Then, the stretched film passed through a heat treating section at 90° C., thereby manufacturing a polyester-based heat-shrinkable film having a thickness of 60 μm.

Metal deposition layers were formed on the manufactured polyester-based heat-shrinkable film under the same conditions as those in Example 17, thereby manufacturing a metalizing film including an upper metal deposition layer having a thickness of 52 nm, a lower metal deposition layer having a thickness of 15 nm, a print layer having a thickness of 2.0 μm, a protective layer having a thickness of 0.4 μm, and an anti-curling layer having a thickness of 1.0 μm.

The obtained metalizing film was evaluated by the above-mentioned methods, and the results were shown in the following Tables 3 and 4.

Example 19

A metalizing film having the same structure as that in Example 17 was manufactured, but at the time of manufacturing a base film, polycondensation was performed by a direct esterification method using 100 mole % of terephthalic acid as a dibasic acid component, 96 mole % of ethylene glycol and 28 mole % of neopentyl glycol as glycol components, and antimony trioxide (0.05 mole based on an acid component) as a catalyst. Silicon dioxide powder (50 ppm) having an average particle size of 2.7 μm was added to the obtained polymer and dried by a method according to the related art, thereby obtaining copolyester having an inherent viscosity of 0.73 dl/g and a melting point of 193° C.

90 weight % of the copolyester and 10 weight % of polybutylene terephthalate of Example 17 were blended with each other and extruded using an extruder at 270° C., followed by rapid cooling, thereby obtaining a solidified unstretched film. The unstretched film passed through a roller transferred in a machine direction and a preheating section at 82° C. and was stretched 3.5 times at 75° C. in a transverse direction. Then, the stretched film passed through a heat treating section at room temperature, thereby manufacturing a polyester-based heat-shrinkable film having a thickness of 40 μm.

Metal deposition layers were formed on the manufactured polyester-based heat-shrinkable film under the same conditions as those in Example 17, thereby manufacturing a metalizing film including an upper metal deposition layer having a thickness of 52 nm, a lower metal deposition layer having a thickness of 15 nm, a print layer having a thickness of 2.0 μm, a protective layer having a thickness of 0.4 μm, and an anti-curling layer having a thickness of 1.0 μm.

The obtained metalizing film was evaluated by the above-mentioned methods, and the results were shown in the following Tables 3 and 4.

Example 20

A metalizing film having the same structure as that in Example 17 was manufactured, but at the time of manufacturing a base film, polycondensation was performed by a direct esterification method using 100 mole % of terephthalic acid as a dibasic acid component, 80 mole % of ethylene glycol and 20 mole % of 1,4-cyclohexane dimethanol as glycol components, and antimony trioxide (0.05 mole based on an acid component) as a catalyst. Silicon dioxide powder (500 ppm) having an average particle size of 2.7 μm was added to the obtained polymer and dried by a method according to the related art, thereby preparing copolyester having an inherent viscosity of 0.68 dl/g and a melting point of 205° C.

The copolyester was extruded at 270° C. using an extruder, followed by rapid cooling and solidification, thereby obtaining an unstretched film. The unstretched film passed through a roller transferred in a machine direction and a preheating section at 85° C. and was stretched 4.2 times at 72° C. in a transverse direction. Then, the stretched film passed through a heat treating section at room temperature, thereby manufacturing a heat-shrinkable film having a thickness of 50 μm.

Metal deposition layers were formed on the manufactured polyester-based heat-shrinkable film under the same conditions as those in Example 17, thereby manufacturing a metalizing film including an upper metal deposition layer having a thickness of 52 nm, a lower metal deposition layer having a thickness of 15 nm, a print layer having a thickness of 2.0 μm, a protective layer having a thickness of 0.4 μm, and an anti-curling layer having a thickness of 1.0 μm.

The obtained metalizing film was evaluated by the above-mentioned methods, and the results were shown in the following Tables 3 and 4.

Example 21

A metalizing film having the same structure as that in Example 17 was manufactured, but a metal (aluminum) deposition layer (thickness: 44 nm) having an optical density of 2.0 was formed on the polyester-based heat-shrinkable film base by evaporating aluminum having a purity of 99.9% using a crucible type evaporator under conditions at which a degree of vacuum at an upper portion of the evaporator was $1.67 \times 10^{-4}$ mbar, a degree of vacuum at a lower portion was $2.38 \times 10^{-2}$ mbar, evaporation was performed at a crucible temperature of 1400° C., a cooling roll temperature was −16° C., and a deposition rate was 450 m/min.

In addition, a metal deposition layer (referred to as a back metal deposition layer, metal: aluminum, thickness: 19 nm) having an optical density of 0.7 was formed on the other surface of the base film by the same method except that the deposition rate was 550 m/min.

Metal deposition layers were formed on the manufactured polyester-based heat-shrinkable film under the same conditions as those in Example 17, thereby manufacturing a metalizing film including an upper metal deposition layer having a thickness of 44 nm, a lower metal deposition layer having a thickness of 19 nm, a print layer having a thickness of 2.0 μm, a protective layer having a thickness of 0.4 µm, and an anti-curling layer having a thickness of 1.0 µm.

The obtained metalizing film was evaluated by the above-mentioned methods, and the results were shown in the following Tables 3 and 4.

Example 22

A metalizing film having the same structure as that in Example 17 was manufactured, but a metal (aluminum) deposition layer (thickness: 65 nm) having an optical density of 2.5 was formed on the polyester-based heat-shrinkable film base by evaporating aluminum having a purity of 99.9% using a crucible type evaporator under conditions at which a degree of vacuum at an upper portion of the evaporator was $1.74 \times 10^{-4}$ mbar, a degree of vacuum at a lower portion was $2.22 \times 10^{-2}$ mbar, evaporation was performed at a crucible temperature of 1400° C., a cooling roll temperature was −20° C., and a deposition rate was 330 m/min.

A metal deposition layer (referred to as a back metal deposition layer, metal: aluminum, thickness: 10 nm) having an optical density of 0.4 was formed on the other surface of the base film by the same method except that the deposition rate was 630 m/min.

Metal deposition layers were formed on the manufactured polyester-based heat-shrinkable film under the same conditions as those in Example 17, thereby manufacturing a metalizing film including an upper metal deposition layer having a thickness of 41 nm, a lower metal deposition layer having a thickness of 20 nm, a print layer having a thickness of 2.0 µm, a protective layer having a thickness of 0.4 µm, and an anti-curling layer having a thickness of 1.0 µm.

The obtained metalizing film was evaluated by the above-mentioned methods, and the results were shown in the following Tables 3 and 4.

Example 23

A metalizing film having the same structure as that in Example 17 was manufactured, but a primer layer was formed on the metal deposition layer before forming a print layer.

More specifically, the primer layer having a thickness of 0.4 µm was formed on the metal deposition layer using a gravure roll from a silane coupling agent (3-glycidoxypropyltrimethoxy silane) diluted with methylethylketone at a concentration of 0.5 weight %, thereby manufacturing a metalizing film including an upper metal deposition layer having a thickness of 52 nm, a lower metal deposition layer having a thickness of 15 nm, a print layer having a thickness of 2.0 µm, a protective layer having a thickness of 0.4 µm, and an anti-curling layer having a thickness of 1.0 µm.

The obtained metalizing film was evaluated by the above-mentioned methods, and the results were shown in the following Tables 3 and 4.

Example 24

A metalizing film having the same structure as that in Example 17 was manufactured, but a primer layer was formed on the metal deposition layer before forming a print layer.

More specifically, the primer layer having a thickness of 0.4 µm was formed using a gravure roll from a coating solution prepared by diluting a mixed varnish composed of 10 weight % of urethane (urethane varnish) and 90 weight % of vinyl chloride (vinyl chloride varnish) with methylethylketone so as to have a solid content of 25%, thereby manufacturing a metalizing film including an upper metal deposition layer having a thickness of 52 nm, a lower metal deposition layer having a thickness of 15 nm, a print layer having a thickness of 2.0 µm, a protective layer having a thickness of 0.4 µm, and an anti-curling layer having a thickness of 1.0 µm.

The obtained metalizing film was evaluated by the above-mentioned methods, and the results were shown in the following Tables 3 and 4.

Example 25

A metalizing film having the same structure as that in Example 17 was manufactured by the same method as in Example 17 except that a print layer (thickness: 1.2 µm) was formed on the metal deposition layer from four kinds of solutions containing 10 weight % of an acrylic resin (BPS-5698™, Samyoung Toyo), 80 weight % of methylethylketone (MEK™, Daesin Chemicals) as a ketone-based solvent, and 10 weight % of one pigment selected from a yellow pigment (YELLOW 10G™, Hyundai Chemical), a red pigment (RED-FRN™, Hyundai Chemical), a green pigment (GREEN 735™, Hyundai Chemical), a black pigment (BLACK #30™, Hyundai Chemical), and a white pigment (R-100™, KPI) to have the entire content of 100 weight % by 4-times printing using a gravure roll, thereby manufacturing a metalizing film including an upper metal deposition layer having a thickness of 52 nm, a lower metal deposition layer having a thickness of 15 nm, a print layer having a thickness of 1.2 µm, a protective layer having a thickness of 0.4 µm, and an anti-curling layer having a thickness of 1.0 µm.

The obtained metalizing film was evaluated by the above-mentioned methods, and the results were shown in the following Tables 3 and 4.

Example 26

A metalizing film having the same structure as that in Example 17 was manufactured by the same method as in Example 17 except that a print layer (thickness: 7.0 µm) was formed on the metal deposition layer from seven kinds of solutions containing 10 weight % of an acrylic resin (BPS-5698™, Samyoung Toyo), 80 weight % of methylethylketone (MEK™, Daesin Chemicals) as a ketone-based solvent, and 10 weight % of one pigment selected from a yellow pigment (YELLOW 10G™, Hyundai Chemical), a red pigment (RED-FRN™, Hyundai Chemical), a green pigment (GREEN 735™, Hyundai Chemical), a black pigment (BLACK #30™, Hyundai Chemical), and a white pigment (R-100™, KPI) to have the entire content of 100 weight % by 7-times printing using a gravure roll, thereby manufacturing a metalizing film including an upper metal deposition layer having a thickness of 52 nm, a lower metal deposition layer having a thickness of 15 nm, a print layer having a thickness of 7.0 µm, a protective layer having a thickness of 0.4 µm, and an anti-curling layer having a thickness of 1.0 µm.

The obtained metalizing film was evaluated by the above-mentioned methods, and the results were shown in the following Tables 3 and 4.

Example 27

A metalizing film having the same structure as that in Example 17 was manufactured by the same method as in Example 17 except that a protective layer (thickness: 0.7 µm) was formed on a print layer using a gravure roll from a solution prepared by diluting a copolyester resin (a copolyester resin prepared by mixing at least two kinds of polyol and polybasic acids and having a number average molecular weight of 5000) with methylethylketone (MEK) so as to have a solid content of 25%, thereby manufacturing a metalizing film including an upper metal deposition layer having a thickness of 52 nm, a lower metal deposition layer having a thickness of 15 nm, a print layer having a thickness of 8.0 μm, a protective layer having a thickness of 0.7 μm, and an anti-curling layer having a thickness of 1.0 μm.

The obtained metalizing film was evaluated by the above-mentioned methods, and the results were shown in the following Tables 3 and 4.

Example 28

A metalizing film having the same structure as that of Example 17 was manufactured by the same method as in Example 17 except that a protective layer (thickness: 0.6 μm) was formed on a print layer using a gravure roll from a solution prepared by diluting a polyolefin copolymer varnish with methylethylketone (MEK) so as to have a solid content of 25 weight %, thereby manufacturing a metalizing film including an upper metal deposition layer having a thickness of 52 nm, a lower metal deposition layer having a thickness of 15 nm, a print layer having a thickness of 8.0 μm, a protective layer having a thickness of 0.6 μm, and an anti-curling layer having a thickness of 1.0 μm.

The obtained metalizing film was evaluated by the above-mentioned methods, and the results were shown in the following Tables 3 and 4.

Example 29

A metalizing film including an upper metal deposition layer having a thickness of 52 nm, a lower metal deposition layer having a thickness of 15 nm, a print layer having a thickness of 2.0 μm, a protective layer having a thickness of 0.4 μm, and an anti-curling layer having a thickness of 1.0 μm was manufactured by the same method as in Example 17 except that a biaxial heat-shrinkable polyester film having a shrinkage rate of 38.3% in a machine direction (MD) of the film, a shrinkage rate of 75.1% in a transverse direction (TD), and a thickness of 50 μm was manufactured by passing a unstretched film obtained by the same method in Example 17 through a preheating section at 65° C., stretching the preheated film 1.7 times at 70° C. in the machine direction of the film, passing the stretched film through a cooling roll at room temperature to cool the film at the time of passing the film through a roller group transferred in the machine direction, and then continuously stretching the film using a tenter in the transverse direction under the same conditions as those in Example 17.

The obtained metalizing film was evaluated by the above-mentioned methods, and the results were shown in the following Tables 3 and 4.

Example 30

A metalizing film including an upper metal deposition layer having a thickness of 52 nm, a lower metal deposition layer having a thickness of 15 nm, a print layer having a thickness of 2.0 μm, a protective layer having a thickness of 0.4 μm, and an anti-curling layer having a thickness of 1.0 μm was manufactured by the same method as in Example 29 except that a biaxial heat-shrinkable polyester film having a shrinkage rate of 44.1% in a machine direction (MD) of the film, a shrinkage rate of 71.3% in a transverse direction (TD), and a thickness of 50 μm was manufactured by passing a unstretched film of Example 29 through a preheating section at 75° C., stretching the preheated film 2.3 times at 75° C. in the machine direction of the film, passing the stretched film through a cooling roll at room temperature to cool the film at the time of passing film through a roller group transferred in the machine direction, and then continuously stretching the film using a tenter in the transverse direction under the same conditions as those in Example 17.

The obtained metalizing film was evaluated by the above-mentioned methods, and the results were shown in the following Tables 3 and 4.

Example 31

A metalizing film having the same structure as that of Example 17 was manufactured by the same method as in Example 17 except that a protective layer was not formed, thereby manufacturing a metalizing film including an upper metal deposition layer having a thickness of 52 nm, a lower metal deposition layer having a thickness of 15 nm, a print layer having a thickness of 2.0 μm, and an anti-curling layer having a thickness of 1.0 μm.

The obtained metalizing film was evaluated by the above-mentioned methods, and the results were shown in the following Tables 3 and 4.

Example 32

Polycondensation was performed by a direct esterification method using 100 mole % of terephthalic acid as a dibasic acid component, 110 mole % of ethylene glycol and 14 mole % of neopentyl glycol as glycol components, and antimony trioxide (0.05 mole based on an acid component) as a catalyst. Silicon dioxide powder (500 ppm) having an average particle size of 2.7 μm was added to the obtained polymer and dried by a method according to the related art, thereby obtaining copolyester having an inherent viscosity of 0.71 dl/g and a melting point of 203° C.

90 weight % of the copolyester and 10 weight % of polybutylene terephthalate of Example 17 were blended with each other and extruded using an extruder at 273° C., followed by rapid cooling and solidification, thereby obtaining an unstretched film. The unstretched film passed through a roller transferred in a machine direction and a preheating section at 90° C. and was stretched 4.1 times at 80° C. in a transverse direction. Then, the stretched film passed through a heat treating section at 92° C., thereby manufacturing a heat-shrinkable film having a thickness of 50 μm.

Metal deposition layers were formed on the manufactured polyester-based heat-shrinkable film under the same conditions as those in Example 17, thereby manufacturing a metalizing film including an upper metal deposition layer having a thickness of 52 nm, a lower metal deposition layer having a thickness of 15 nm, a print layer having a thickness of 2.0 μm, a protective layer having a thickness of 0.4 μm, and an anti-curling layer having a thickness of 1.0 μm.

The obtained metalizing film was evaluated by the above-mentioned methods, and the results were shown in the following Tables 3 and 4.

Comparative Example 4

A metalizing film having the same structure as that in Example 17 was manufactured under the same conditions as those in Example 17 except for using a PET film (50 μm, CE series, Kolon Industries Co.) as a base film, thereby manufacturing a metalizing film including an upper metal deposition layer having a thickness of 52 nm, a lower metal deposition layer having a thickness of 15 nm, a print layer having a thickness of 2.0 μm, a protective layer having a thickness of 0.4 μm, and an anti-curling layer having a thickness of 1.0 μm.

The obtained metalizing film was evaluated by the above-mentioned methods, and the results were shown in the following Tables 3 and 4.

Comparative Example 5

A metalizing film having the same structure as that in Example 17 was manufactured, but a metal (aluminum) deposition layer (thickness: 121 nm) having an optical density of 3.5 was formed on the polyester-based heat-shrinkable film base by evaporating aluminum having a purity of 99.9% using a crucible type evaporator under conditions at which a degree of vacuum at an upper portion of the evaporator was $1.93 \times 10^{-4}$ mbar, a degree of vacuum at a lower portion was $2.22 \times 10^{-2}$ mbar, evaporation was performed at a crucible temperature of 1400° C., a cooling roll temperature was −20° C., and a deposition rate was 200 m/min.

A metal deposition layer (referred to as a back metal deposition layer, metal: aluminum, thickness: 15 nm) having an optical density of 0.5 was formed on the other surface of the base film by the same method except that the deposition rate was 600 m/min.

Metal deposition layers were formed on the manufactured polyester-based heat-shrinkable film under the same conditions as those in Example 17, thereby manufacturing a metalizing film including an upper metal deposition layer having a thickness of 121 nm, a lower metal deposition layer having a thickness of 15 nm, a print layer having a thickness of 2.0 μm, a protective layer having a thickness of 0.4 μm, and an anti-curling layer having a thickness of 1.0 μm.

The obtained metalizing film was evaluated by the above-mentioned methods, and the results were shown in the following Tables 3 and 4.

Comparative Example 6

A metalizing film having the same structure as that in Example 17 was manufactured, but a metal (aluminum) deposition layer (thickness: 10 nm) having an optical density of 0.4 was formed on both surfaces of the polyester-based heat-shrinkable film base by evaporating aluminum having a purity of 99.9% using a crucible type evaporator under conditions at which a degree of vacuum at an upper portion of the evaporator was $2.01 \times 10^{-4}$ mbar, a degree of vacuum at a lower portion was $1.89 \times 10^{-2}$ mbar, evaporation was performed at a crucible temperature of 1400° C., a cooling roll temperature was −15° C., and a deposition rate was 630 m/min.

The metal deposition layers were formed on the manufactured polyester-based heat-shrinkable film under the same conditions as those in Example 17, thereby manufacturing a metalizing film including an upper metal deposition layer having a thickness of 10 nm, a lower metal deposition layer having a thickness of 10 nm, a print layer having a thickness of 2.0 μm, a protective layer having a thickness of 0.4 μm, and an anti-curling layer having a thickness of 1.0 μm.

The obtained metalizing film was evaluated by the above-mentioned methods, and the results were shown in the following Tables 3 and 4.

Comparative Example 7

A metalizing film having the same structure as that in Example 17 was manufactured by the same method as in Example 17 except that a print layer (thickness: 12.0 μm) was formed on the metal deposition layer from six kinds of solutions containing 10 weight % of an acrylic resin (BPS-5698™, Samyoung Toyo), 80 weight % of methylethylketone (MEK™, Daesin Chemicals) as a ketone-based solvent, and 10 weight % of one pigment selected from a yellow pigment (YELLOW 10G™, Hyundai Chemical), a red pigment (RED-FRN™, Hyundai Chemical), a green pigment (GREEN 735™, Hyundai Chemical), a black pigment (BLACK #30™, Hyundai Chemical), and a white pigment (R-100™, KPI) to have the entire content of 100 weight % by 6-times printing using a gravure roll, thereby manufacturing a metalizing film including an upper metal deposition layer having a thickness of 52 nm, a lower metal deposition layer having a thickness of 15 nm, a print layer having a thickness of 2.0 μm, a protective layer having a thickness of 0.4 μm, and an anti-curling layer having a thickness of 1.0 μm.

The obtained metalizing film was evaluated by the above-mentioned methods, and the results were shown in the following Tables 3 and 4.

Comparative Example 8

A metalizing film having the same structure as that of Example 17 was manufactured by the same method as in Example 17 except that a print layer (thickness: 0.2 μm) was formed on the metal deposition layer from two kinds of solutions containing 10 weight % of an acrylic resin (BPS-5698™, Samyoung Toyo), 80 weight % of methylethylketone (MEK™, Daesin Chemicals) as a ketone-based solvent, and 10 weight % of one pigment selected from a yellow pigment (YELLOW 10G™, Hyundai Chemical), a red pigment (RED-FRN™, Hyundai Chemical), a green pigment (GREEN 735™, Hyundai Chemical), a black pigment (BLACK #30™, Hyundai Chemical), and a white pigment (R-100™, KPI) to have the entire content of 100 weight % by 2-times printing using a gravure roll, thereby manufacturing a metalizing film including an upper metal deposition layer having a thickness of 52 nm, a lower metal deposition layer having a thickness of 15 nm, a print layer having a thickness of 2.0 μm, a protective layer having a thickness of 0.4 μm, and an anti-curling layer having a thickness of 1.0 μm.

The obtained metalizing film was evaluated by the above-mentioned methods, and the results were shown in the following Tables 3 and 4.

TABLE 3

| | Base film | Metalizing film | | | | | |
|---|---|---|---|---|---|---|---|
| | Heat shrinkage | | Analysis by thermal stress tester | | | Heat shrinkage | Total |
| | rate (TD direction, %) | Haze (%) | Ts (° C.) | $T_{(Smax)}$ (° C.) | $S_{max}$ (kg/mm$^2$) | rate (TD direction, %) | transmittance (%) |
| Example 17 | 77.3 | 5.2 | 82.4 | 91.2 | 1.24 | 77.0 | 0.21 |
| Example 18 | 40.1 | 8.2 | 95.2 | 111.6 | 0.71 | 40.0 | 0.16 |
| Example 19 | 68.7 | 0.5 | 72.1 | 85.1 | 1.46 | 66.2 | 0.24 |
| Example 20 | 78.5 | 4.3 | 88.2 | 99.7 | 0.67 | 75.3 | 0.20 |

TABLE 3-continued

|  | Base film | | Metalizing film | | | | |
|---|---|---|---|---|---|---|---|
|  | Heat shrinkage | | Analysis by thermal stress tester | | | Heat shrinkage | Total |
|  | rate (TD direction, %) | Haze (%) | Ts (° C.) | $T_{(Smax)}$ (° C.) | $S_{max}$ (kg/mm$^2$) | rate (TD direction, %) | transmittance (%) |
| Example 21 | 77.4 | 5.3 | 83.3 | 91.7 | 1.26 | 77.1 | 0.28 |
| Example 22 | 77.7 | 5.1 | 82.4 | 91.6 | 1.24 | 77.5 | 0.13 |
| Example 23 | 77.3 | 5.2 | 82.3 | 91.5 | 1.23 | 77.1 | 0.19 |
| Example 24 | 77.4 | 5.3 | 82.4 | 91.4 | 1.24 | 77.3 | 0.21 |
| Example 25 | 77.4 | 5.1 | 82.4 | 91.3 | 1.23 | 77.2 | 0.20 |
| Example 26 | 77.3 | 5.0 | 82.3 | 91.3 | 1.25 | 77.1 | 0.21 |
| Example 27 | 77.3 | 5.2 | 82.4 | 91.4 | 1.26 | 77.2 | 0.20 |
| Example 28 | 77.4 | 5.3 | 82.2 | 91.3 | 1.23 | 77.2 | 0.20 |
| Example 29 | 75.1 | 5.9 | 83.2 | 93.5 | 1.18 | 73.7 | 0.20 |
| Example 30 | 71.3 | 6.4 | 84.5 | 95.7 | 1.12 | 68.1 | 0.19 |
| Example 31 | 77.4 | 5.2 | 82.2 | 90.9 | 1.23 | 77.1 | 0.21 |
| Example 32 | 76.2 | 4.8 | 83.1 | 91.3 | 1.25 | 75.9 | 0.23 |
| Comparative Example 4 | 1.7 | 2.4 | 231.8 | 273.0 | 0.12 | 1.5 | 0.20 |
| Comparative Example 5 | 77.3 | 5.3 | 82.4 | 91.3 | 1.22 | 77.0 | 9.23 |
| Comparative Example 6 | 77.4 | 5.3 | 82.0 | 90.9 | 1.28 | 77.2 | 11.31 |
| Comparative Example 7 | 77.4 | 5.3 | 82.2 | 91.3 | 1.24 | 77.1 | 0.20 |
| Comparative Example 8 | 77.3 | 5.4 | 82.3 | 91.3 | 1.23 | 77.2 | 0.19 |

TABLE 4

|  | Metalizing film | | | | |
|---|---|---|---|---|---|
|  | curl degree evaluation (mm) (values measured at four edges) | Curl characteristic value (mm) | Printing adhesion property | Adhesion property of label (%) | Separation property of label (%) |
| Example 17 | 1.4/0.7/0.8/1.3 | 1.4 | ○ | 99.9 | 99.9 |
| Example 18 | 2.1/2.3/2.2/0.7 | 2.3 | ○ | 100.0 | 100.0 |
| Example 19 | 0.8/0.5/1.4/0.4 | 1.4 | ○ | 100.0 | 100.0 |
| Example 20 | 0.7/1.5/1.2/0.4 | 1.5 | ○ | 99.9 | 100.0 |
| Example 21 | 1.2/1.1/2.2/1.1 | 2.2 | ○ | 100.0 | 99.8 |
| Example 22 | 1.5/1.7/0.5/0.3 | 1.7 | ○ | 99.9 | 100.0 |
| Example 23 | 1.4/1.0/0.4/0.8 | 1.4 | ○ | 100.0 | 100.0 |
| Example 24 | 1.4/1.4/0.7/0.3 | 1.4 | ○ | 100.0 | 99.9 |
| Example 25 | 1.5/1.4/0.7/1.2 | 1.5 | ○ | 100.0 | 99.9 |
| Example 26 | 2.2/0.8/0.7/1.3 | 2.2 | ○ | 99.9 | 100.0 |
| Example 27 | 1.3/1.8/1.2/0.6 | 1.8 | ○ | 100.0 | 100.0 |
| Example 28 | 1.1/1.7/1.5/1.2 | 1.7 | ○ | 100.0 | 99.9 |
| Example 29 | 0.8/1.2/1.8/1.7 | 1.8 | ○ | 99.9 | 99.9 |
| Example 30 | 1.7/1.8/3.2/1.8 | 3.2 | ○ | 100.0 | 100.0 |
| Example 31 | 1.5/2.3/2.1/0.6 | 2.3 | Δ | 100.0 | 100.0 |
| Example 32 | 2.4/2.2/2.8/4.1 | 4.1 | ○ | 99.9 | 84.1 |
| Comparative Example 4 | 0.7/2.7/1.8/0.8 | 2.7 | ○ | 99.8 | 2.7 |
| Comparative Example 5 | −5.2/−6.7/−5.7/−8.9 | −8.9 | ○ | 88.2 | 99.8 |
| Comparative Example 6 | 5.3/5.2/4.3/6.1 | 6.1 | ○ | 86.3 | 99.9 |
| Comparative Example 7 | 7.2/8.2/5.5/5.3 | 8.2 | ○ | 84.7 | 99.5 |
| Comparative Example 8 | −4.7/−6.3/−4.3/−3.3 | −6.3 | ○ | 83.8 | 99.8 |

It may be appreciated from the results shown in Table 3 and 4 that in the metalizing films of the Examples according to the present invention, the shrinkage stress, the shrinkability, the total transmittance, and the printing adhesion property were excellent, and the adhesion property and separation property of the label were high, such that the metalizing films may replace a generally used paper label, and the label may be removed by an eco-friendly means. Particularly, among the Examples, in the case of Examples 29 and 30 in which the stretching was performed in both of the machine direction and the transverse direction of the film, the adhesion property and separation property of the label were excellent, such that the process applicability of the label was excellent, and it may be relatively easy to separate the label peeled off and detached from the bottle and the bottle from each other, as compared to other Examples. Particularly, in a floating type bottle washer of introducing water into the bottle washer to float a label on water surface by using pressure of water and collecting a separated label using a hook at an upper portion of the bottle washer, in the cases of other Examples in which the stretching was performed only in the transverse direction of the film, a label curling phenomenon in the maximum shrinkage direction of the film was generated, such that at the time of floating the label to the upper portion of the bottle washer, pressure or a flux of water needs to be increased, but in the cases of Examples 29 and 30, at the time of separating the label from the bottle, a bidirectional shrinkage phenomenon was generated, which alleviates the label curling phenomenon, such that it may be easy to float the label to the upper portion of the bottle washer to separate the label from the bottle, as compared to other Examples. Therefore, the cases of Examples 29 and 30 were advantageous in view of reduction of water and energy consumption.

On the other hand, it may be appreciated that in Comparative Example 4 in which the heat-shrinkable polyester-based base film was not used, separation of the label in simple hot water was substantially impossible.

In addition, it may be appreciated that in the cases of Comparative Examples 5, 6, 7, and 8 in which the thicknesses of the upper and lower metal deposition layers and the print layer were not controlled, the adhesion property of the label was significantly reduced.

Further, in the cases of Comparative Example 6 in which the thickness of the metal deposition layer was thin, the adhesion property of the label was deteriorated due to a warpage phenomenon of the label, and total transmittance of the heat-shrinkable metalizing film was high, such that at the time of applying a print label, which is a final product, to a colored bottle, the color of the bottle may be reflected, which may deteriorate a printing effect and visibility of printed patterns, thereby deteriorating an aesthetic property of the advertisement.

Meanwhile, in the case of Example 31 to which the protective layer was not applied, there were no problems in the adhesion property and separation property, but the metal deposition layer and the print layer of the print label were separated from each other at the time of separating the print label, such that the print label separating material may contaminate water, which may cause secondary contamination of the bottle. As a result, additional washing of the bottle should be performed. There was no problem in the entire processability, but since the washing process of the bottle should be added after separating the print label, at the time of applying the print label, process cost may be increased.

Meanwhile, it may be confirmed that in Example 32, the visibility was satisfied and the separation property of the label was suitable, but at the time of removing the print label from the bottle, the print label was attached to the bottle in some cases, such that at the time of removing the print label, several processes should be performed, thereby deteriorating economic efficiency. The reason is due to a high initial shrinkage temperature and low maximum shrinkage stress, and it may be appreciated that in order to optimize the separation property of the label, the shrinkability needs to be controlled.

Example 33

Polycondensation was performed by a direct esterification method using 100 mole % of terephthalic acid as a dibasic acid component, 100 mole % of ethylene glycol and 24 mole % of neopentyl glycol as glycol components, and antimony trioxide (0.05 mole based on an acid component) as a catalyst. Silicon dioxide powder (500 ppm) having an average particle size of 2.7 μm was added to the obtained polymer and dried by a method according to the related art, thereby obtaining copolyester having an inherent viscosity of 0.71 dl/g and a melting point of 203° C.

Meanwhile, a polybutylene terephthalate resin (inherent viscosity: 0.97 dl/g, melting point: 220° C.) was obtained using 100 mole % of terephthalic acid and 100 mole % of 1,4-butadiol by injecting 0.015 parts by weight of tetrabutyl titanate as a catalyst.

90 weight % of the copolyester and 10 weight % of polybutylene terephthalate were blended with each other and extruded using an extruder at 270° C., followed by rapid cooling and solidification, thereby obtaining an unstretched film. The unstretched film passed through a roller transferred in a machine direction and a preheating section at 85° C. and was stretched 4.2 times at 72° C. in a transverse direction. Then, the stretched film passed through a heat treating section at room temperature, thereby manufacturing a polyester-based heat-shrinkable film having a thickness of 50 μm. The obtained film had a thickness of 50 μm, and a heat shrinkage rate and a haze measured by the methods as described above were 77.4% (TD direction) and 5.3%, respectively.

A metal (aluminum) deposition layer (thickness: 52 nm) having an optical density of 2.2 was formed on the obtained polyester-based heat-shrinkable film by evaporating aluminum having a purity of 99.9% using a crucible type evaporator under conditions at which a degree of vacuum at an upper portion of the evaporator was $1.07 \times 10^{-4}$ mbar, a degree of vacuum at a lower portion was $2.13 \times 10^{-2}$ mbar, evaporation was performed at a crucible temperature of 1400° C., a cooling roll temperature was −16° C., and a deposition rate was 400 m/min.

A print layer (thickness: 2.0 μm) was formed on the metal deposition layer from five kinds of solutions containing 10 weight % of an acrylic resin (BPS-5698™, Samyoung Toyo), 80 weight % of methylethylketone (MEK™, Daesin Chemicals) as a ketone-based solvent, and 10 weight % of one pigment selected from a yellow pigment (YELLOW 10G™, Hyundai Chemical), a red pigment (RED-FRN™, Hyundai Chemical), a green pigment (GREEN 735™, Hyundai Chemical), a black pigment (BLACK #30™, Hyundai Chemical), and a white pigment (R-100™, KPI) to have the entire content of 100 weight % by 5-times printing using a gravure roll.

A protective layer (thickness: 0.4 μm) was formed on the print layer from a solution containing alcohol (E'VANOL 70-75™, Dupont) and polyamide (MO-5336™, Motochem) to have the entire content of 100 weight % by 1-times printing after controlling a depth of a gravure roll.

Meanwhile, an anti-curling layer having a thickness of 1.0 μm was formed from a solution containing 10 weight % of the acrylic resin (BPS-5698™, Samyoung Toyo), 89 weight % of methylethylketone (MEK™, Daesin Chemicals) as the ketone-based solvent, the white pigment (R-100™, KPI), an anti-precipitation agent, a thickening agent, a color-separation preventing agent, and a pigment dispersant to have the entire content of 100 weight % by 2-times printing after controlling a depth of a gravure roll, thereby manufacturing a metalizing film according to the present invention.

The obtained metalizing film was evaluated by the above-mentioned methods, and the results were shown in the following Tables 5 and 6.

Example 34

A metalizing film having the same structure as that in Example 33 was manufactured, but at the time of manufacturing a base film, polycondensation was performed by a direct esterification method using 100 mole % of terephthalic acid as a dibasic acid component, 106 mole % of ethylene glycol and 18 mole % of neopentyl glycol as glycol components, and antimony trioxide (0.05 mole based on an acid component) as a catalyst. Silicon dioxide powder (500 ppm) having an average particle size of 2.7 μm was added to the obtained polymer and dried by a method according to the related art, thereby obtaining copolyester having an inherent viscosity of 0.63 dl/g and a melting point of 218° C.

90 weight % of the copolyester and 10 weight % of polybutylene terephthalate of Example 33 were blended with each other and extruded using an extruder at 270° C., followed by rapid cooling, thereby obtaining a solidified unstretched film. The unstretched film passed through a roller transferred in a machine direction and a preheating section at 92° C. and was stretched 4.0 times at 72° C. in a transverse direction. Then, the stretched film passed through a heat treating section at 90° C., thereby manufacturing a polyester-based heat-shrinkable film having a thickness of 60 μm.

A metal deposition layer was formed on the manufactured polyester-based heat-shrinkable film under the same conditions as those in Example 33, thereby manufacturing a metalizing film including a metal deposition layer having a thickness of 52 nm, a print layer having a thickness of 2.0 μm, a protective layer having a thickness of 0.4 μm, and an anti-curling layer having a thickness of 1.0 μm.

The obtained metalizing film was evaluated by the above-mentioned methods, and the results were shown in the following Tables 5 and 6.

Example 35

A metalizing film having the same structure as that in Example 33 was manufactured, but at the time of manufacturing a base film, polycondensation was performed by a direct esterification method using 100 mole % of terephthalic acid as a dibasic acid component, 96 mole % of ethylene glycol and 28 mole % of neopentyl glycol as glycol components, and antimony trioxide (0.05 mole based on an acid component) as a catalyst. Silicon dioxide powder (50 ppm) having an average particle size of 2.7 μm was added to the obtained polymer and dried by a method according to the related art, thereby obtaining copolyester having an inherent viscosity of 0.73 dl/g and a melting point of 193° C.

90 weight % of the copolyester and 10 weight % of polybutylene terephthalate of Example 33 were blended with each other and extruded using an extruder at 270° C., followed by rapid cooling, thereby obtaining a solidified unstretched film. The unstretched film passed through a roller transferred in a machine direction and a preheating section at 82° C. and was stretched 4.0 times at 70° C. in a transverse direction. Then, the stretched film passed through a heat treating section at room temperature, thereby manufacturing a polyester-based heat-shrinkable film having a thickness of 40 μm.

A metal deposition layer was formed on the manufactured polyester-based heat-shrinkable film under the same conditions as those in Example 33, thereby manufacturing a metalizing film including a metal deposition layer having a thickness of 52 nm, a print layer having a thickness of 2.0 μm, a protective layer having a thickness of 0.4 μm, and an anti-curling layer having a thickness of 1.0 μm.

The obtained metalizing film was evaluated by the above-mentioned methods, and the results were shown in the following Tables 5 and 6.

Example 36

A metalizing film having the same structure as that in Example 33 was manufactured, but at the time of manufacturing a base film, polycondensation was performed by a direct esterification method using 100 mole % of terephthalic acid as a dibasic acid component, 80 mole % of ethylene glycol and 20 mole % of 1,4-cyclohexane dimethanol as glycol components, and antimony trioxide (0.05 mole based on an acid component) as a catalyst. Silicon dioxide powder (500 ppm) having an average particle size of 2.7 μm was added to the obtained polymer and dried by a method according to the related art, thereby preparing copolyester having an inherent viscosity of 0.68 dl/g and a melting point of 205° C.

The copolyester was extruded at 270° C. using an extruder, followed by rapid cooling and solidification, thereby obtaining an unstretched film. The unstretched film passed through a roller transferred in a machine direction and a preheating section at 85° C. and was stretched 4.2 times at 72° C. in a transverse direction. Then, the stretched film passed through a heat treating section at room temperature, thereby manufacturing a heat-shrinkable film having a thickness of 50 μm.

A metal deposition layer was formed on the manufactured polyester-based heat-shrinkable film under the same conditions as those in Example 33, thereby manufacturing a metalizing film including a metal deposition layer having a thickness of 52 nm, a print layer having a thickness of 2.0 μm, a protective layer having a thickness of 0.4 μm, and an anti-curling layer having a thickness of 1.0 μm.

The obtained metalizing film was evaluated by the above-mentioned methods, and the results were shown in the following Tables 5 and 6.

Example 37

A metalizing film having the same structure as that of Example 33 was manufactured, but a metal (aluminum) deposition layer (thickness: 41 nm) having an optical density of 1.9 was formed on the polyester-based heat-shrinkable film base by evaporating aluminum having a purity of 99.9% using a crucible type evaporator under conditions at which a degree of vacuum at an upper portion of the evaporator was $1.52 \times 10^{-4}$ mbar, a degree of vacuum at a lower portion was $1.97 \times 10^{-2}$ mbar, evaporation was performed at a crucible temperature of 1400° C., a cooling roll temperature was −16° C., and a deposition rate was 450 m/min.

The same processes as those in Example 33 were performed on the manufactured polyester-based heat-shrinkable film under the same conditions as those in Example 33, thereby manufacturing a metalizing film including a metal deposition layer having a thickness of 41 nm, a print layer having a thickness of 2.0 μm, a protective layer having a thickness of 0.4 μm, and a anti-curling layer having a thickness of 1.0 μm.

The obtained metalizing film was evaluated by the above-mentioned methods, and the results were shown in the following Tables 5 and 6.

Example 38

A metalizing film having the same structure as that of Example 33 was manufactured, but a metal (aluminum) deposition layer (thickness: 65 nm) having an optical density of 1.9 was formed on the polyester-based heat-shrinkable film base by evaporating aluminum having a purity of 99.9% using a crucible type evaporator under conditions at which a degree of vacuum at an upper portion of the evaporator was $1.83 \times 10^{-4}$ mbar, a degree of vacuum at a lower portion was $2.18 \times 10^{-2}$ mbar, evaporation was performed at a crucible temperature of 1400° C., a cooling roll temperature was −20° C., and a deposition rate was 330 m/min.

The same processes as those in Example 33 were performed on the manufactured polyester-based heat-shrinkable film under the same conditions as those in Example 33, thereby manufacturing a metalizing film including a metal deposition layer having a thickness of 65 nm, a print layer having a thickness of 2.0 µm, a protective layer having a thickness of 0.4 µm, and a anti-curling layer having a thickness of 1.0 µm.

The obtained metalizing film was evaluated by the above-mentioned methods, and the results were shown in the following Tables 5 and 6.

Example 39

A metalizing film having the same structure as that of Example 33 was manufactured, but a primer layer was formed on the metal deposition layer before forming a print layer.

More specifically, the primer layer having a thickness of 0.4 µm was formed on the metal deposition layer using a gravure roll from a silane coupling agent (3-glycidoxypropyltrimethoxy silane) diluted with methylethylketone at a concentration of 0.5 weight %, thereby manufacturing a metalizing film including the metal deposition layer having a thickness of 52 nm, a print layer having a thickness of 2.0 µm, a protective layer having a thickness of 0.4 µm, and a anti-curling layer having a thickness of 1.0 µm.

The obtained metalizing film was evaluated by the above-mentioned methods, and the results were shown in the following Tables 5 and 6.

Example 40

A metalizing film having the same structure as that of Example 33 was manufactured, but a primer layer was formed on the metal deposition layer before forming a print layer.

More specifically, the primer layer having a thickness of 0.4 µm was formed using a gravure roll from a coating solution prepared by diluting a mixed varnish composed of 10 weight % of urethane (urethane varnish) and 90 weight % of vinyl chloride (vinyl chloride varnish) with methylethylketone so as to have a solid content of 25%, thereby manufacturing a metalizing film including the metal deposition layer having a thickness of 52 nm, a print layer having a thickness of 2.0 µm, a protective layer having a thickness of 0.4 µm, and a anti-curling layer having a thickness of 1.0 µm.

The obtained metalizing film was evaluated by the above-mentioned methods, and the results were shown in the following Tables 5 and 6.

Example 41

A metalizing film having the same structure as that of Example 33 was manufactured by the same method as in Example 33 except that a print layer (thickness: 1.0 µm) was formed on the metal deposition layer from three kinds of solutions containing 10 weight % of an acrylic resin (BPS-5698™, Samyoung Toyo), 80 weight % of methylethylketone (MEK™, Daesin Chemicals) as a ketone-based solvent, and 10 weight % of one pigment selected from a yellow pigment (YELLOW 10G™, Hyundai Chemical), a red pigment (RED-FRN™, Hyundai Chemical), a green pigment (GREEN 735™, Hyundai Chemical), a black pigment (BLACK #30™, Hyundai Chemical), and a white pigment (R-100™, KPI) to have the entire content of 100 weight % by 3-times printing using a gravure roll, thereby manufacturing a metalizing film including the metal deposition layer having a thickness of 52 nm, the print layer having a thickness of 1.0 µm, a protective layer having a thickness of 0.4 µm, and an anti-curling layer having a thickness of 1.0 µm.

The obtained metalizing film was evaluated by the above-mentioned methods, and the results were shown in the following Tables 5 and 6.

Example 42

A metalizing film having the same structure as that of Example 33 was manufactured by the same method as in Example 33 except that a print layer (thickness: 8.0 µm) was formed on the metal deposition layer from eight kinds of solutions containing 10 weight % of an acrylic resin (BPS-5698™, Samyoung Toyo), 80 weight % of methylethylketone (MEK™, Daesin Chemicals) as a ketone-based solvent, and 10 weight % of one pigment selected from a yellow pigment (YELLOW 10G™, Hyundai Chemical), a red pigment (RED-FRN™, Hyundai Chemical), a green pigment (GREEN 735™, Hyundai Chemical), a black pigment (BLACK #30™, Hyundai Chemical), and a white pigment (R-100™, KPI) to have the entire content of 100 weight % by 8-times printing using a gravure roll, thereby manufacturing a metalizing film including the metal deposition layer having a thickness of 52 nm, the print layer having a thickness of 8.0 µm, a protective layer having a thickness of 0.4 µm, and an anti-curling layer having a thickness of 1.0 µm.

The obtained metalizing film was evaluated by the above-mentioned methods, and the results were shown in the following Tables 5 and 6.

Example 43

A metalizing film having the same structure as that of Example 33 was manufactured by the same method as in Example 33 except that a protective layer (thickness: 0.8 µm) was formed on a print layer using a gravure roll from a solution prepared by diluting a copolyester resin (a copolyester resin prepared by mixing at least two kinds of polyol and polybasic acids and having a number average molecular weight of 5000) with methylethylketone (MEK) so as to have a solid content of 25%, thereby manufacturing a metalizing film including a metal deposition layer having a thickness of 52 nm, the print layer having a thickness of 2.0 µm, a protective layer having a thickness of 0.8 µm, and an anti-curling layer having a thickness of 1.0 µm.

The obtained metalizing film was evaluated by the above-mentioned methods, and the results were shown in the following Tables 5 and 6.

Example 44

A metalizing film having the same structure as that of Example 33 was manufactured by the same method as in Example 33 except that a protective layer (thickness: 0.4 µm) was formed on a print layer using a gravure roll from a solution prepared by diluting a polyolefin copolymer varnish with methylethylketone (MEK) so as to have a solid content of 25 weight %, thereby manufacturing a metalizing film including a metal deposition layer having a thickness of 52 nm, the print layer having a thickness of 2.0 µm, a protective layer having a thickness of 0.4 µm, and an anti-curling layer having a thickness of 1.0 µm.

The obtained metalizing film was evaluated by the above-mentioned methods, and the results were shown in the following Tables 5 and 6.

Example 45

A metalizing film including a metal deposition layer having a thickness of 52 nm, a print layer having a thickness of 2.0 µm, a protective layer having a thickness of 0.4 µm, and an anti-curling layer having a thickness of 1.0 µm was manufactured by the same method as in Example 33 except that a biaxial heat-shrinkable polyester film having a shrinkage rate of 37.3% in a machine direction (MD) of the film, a shrinkage rate of 74.9% in a transverse direction (TD), and a thickness of 50 µm was manufactured by passing a unstretched film obtained by the same method in Example 33 through a preheating section at 65° C., stretching the preheated film 1.6 times at 70° C. in the machine direction of the film, passing the stretched film through a cooling roll at room temperature to cool the film at the time of passing film through a roller group transferred in the machine direction, and then continuously stretching the film using a tenter in the transverse direction under the same conditions as those in Example 33.

The obtained metalizing film was evaluated by the above-mentioned methods, and the results were shown in the following Tables 5 and 6.

Example 46

A metalizing film including a metal deposition layer having a thickness of 52 nm, a print layer having a thickness of 2.0 µm, a protective layer having a thickness of 0.4 µm, and an anti-curling layer having a thickness of 1.0 µm was manufactured by the same method as in Example 45 except that a biaxial heat-shrinkable polyester film having a shrinkage rate of 45.8% in a machine direction (MD) of the film, a shrinkage rate of 70.5% in a transverse direction (TD), and a thickness of 50 µm was manufactured by passing a unstretched film of Example 45 through a preheating section at 75° C., stretching the preheated film 2.5 times at 75° C. in the machine direction of the film, passing the stretched film through a cooling roll at room temperature to cool the film at the time of passing film through a roller group transferred in the machine direction, and then continuously stretching the film using a tenter in the transverse direction under the same conditions as those in Example 33.

The obtained metalizing film was evaluated by the above-mentioned methods, and the results were shown in the following Tables 5 and 6.

Example 47

A metalizing film having the same structure as that of Example 33 was manufactured by the same method as in Example 33 except that a protective layer was not formed, thereby manufacturing a metalizing film including a metal deposition layer having a thickness of 52 nm, a print layer having a thickness of 2.0 µm, and an anti-curling layer having a thickness of 1.0 µm.

The obtained metalizing film was evaluated by the above-mentioned methods, and the results were shown in the following Tables 5 and 6.

Example 48

A metalizing film having the same structure as that in Example 33 was manufactured, but a metal (aluminum) deposition layer (thickness: 10 nm) having an optical density of 1.5 was formed on the polyester-based heat-shrinkable film base by evaporating aluminum having a purity of 99.9% using a crucible type evaporator under conditions at which a degree of vacuum at an upper portion of the evaporator was 1.79× 10$^{-4}$ mbar, a degree of vacuum at a lower portion was 2.03× 10$^{-2}$ mbar, evaporation was performed at a crucible temperature of 1400° C., a cooling roll temperature was −10° C., and a deposition rate was 500 m/min.

The same processes as those in Example 33 were performed on the manufactured polyester-based heat-shrinkable film under the same conditions as those in Example 33, thereby manufacturing a metalizing film including a metal deposition layer having a thickness of 10 nm, a print layer having a thickness of 2.0 µm, a protective layer having a thickness of 0.4 µm, and a anti-curling layer having a thickness of 1.0 µm.

The obtained metalizing film was evaluated by the above-mentioned methods, and the results were shown in the following Tables 5 and 6.

Example 49

Polycondensation was performed by a direct esterification method using 100 mole % of terephthalic acid as a dibasic acid component, 110 mole % of ethylene glycol and 14 mole % of neopentyl glycol as glycol components, and antimony trioxide (0.05 mole based on an acid component) as a catalyst. Silicon dioxide powder (500 ppm) having an average particle size of 2.7 µm was added to the obtained polymer and dried by a method according to the related art, thereby obtaining copolyester having an inherent viscosity of 0.71 dl/g and a melting point of 203° C.

90 weight % of the copolyester and 10 weight % of polybutylene terephthalate of Example 33 were blended with each other and extruded using an extruder at 270° C., followed by rapid cooling and solidification, thereby obtaining an unstretched film. The unstretched film passed through a roller transferred in a machine direction and a preheating section at 92° C. and was stretched 4.0 times at 80° C. in a transverse direction. Then, the stretched film passed through a heat treating section at 95° C., thereby manufacturing a heat-shrinkable film having a thickness of 50 µm.

A metal deposition layer was formed on the manufactured polyester-based heat-shrinkable film under the same conditions as those in Example 33, thereby manufacturing a metalizing film including a metal deposition layer having a thickness of 52 nm, a print layer having a thickness of 2.0 µm, a protective layer having a thickness of 0.4 µm, and a anti-curling layer having a thickness of 1.0 µm. The obtained metalizing film was evaluated by the above-mentioned methods, and the results were shown in the following Tables 5 and 6.

Example 50

A metalizing film having the same structure as that of Example 33 was manufactured by the same method as in Example 33 except that a print layer (thickness: 12.0 µm) was formed on the metal deposition layer from six kinds of solutions containing 10 weight % of an acrylic resin (BPS-5698™, Samyoung Toyo), 80 weight % of methylethylketone (MEK™, Daesin Chemicals) as a ketone-based solvent, and 10 weight % of one pigment selected from a yellow pigment (YELLOW 10G™, Hyundai Chemical), a red pigment (RED-FRN™, Hyundai Chemical), a green pigment (GREEN 735™, Hyundai Chemical), a black pigment (BLACK #30™, Hyundai Chemical), and a white pigment (R-100™, KPI) to have the entire content of 100 weight % by 6-times printing using a gravure roll, thereby manufacturing a metalizing film including the metal deposition layer having a thickness of 52 nm, the print layer having a thickness of 12.0 µm, a protective layer having a thickness of 0.4 µm, and an anti-curling layer having a thickness of 1.0 µm.

The obtained metalizing film was evaluated by the above-mentioned methods, and the results were shown in the following Tables 5 and 6.

Example 51

A metalizing film having the same structure as that of Example 33 was manufactured by the same method as in Example 33 except that a print layer (thickness: 0.2 μm) was formed on the metal deposition layer from two kinds of solutions containing 10 weight % of an acrylic resin (BPS-5698™, Samyoung Toyo), 80 weight % of methylethylketone (MEK™, Daesin Chemicals) as a ketone-based solvent, and 10 weight % of one pigment selected from a yellow pigment (YELLOW 10G™, Hyundai Chemical), a red pigment (RED-FRN™, Hyundai Chemical), a green pigment (GREEN 735™, Hyundai Chemical), a black pigment (BLACK #30™, Hyundai Chemical), and a white pigment (R-100™, KPI) to have the entire content of 100 weight % by 2-times printing using a gravure roll, thereby manufacturing a metalizing film including the metal deposition layer having a thickness of 52 nm, the print layer having a thickness of 12.0 μm, a protective layer having a thickness of 0.4 μm, and an anti-curling layer having a thickness of 1.0 μm.

The obtained metalizing film was evaluated by the above-mentioned methods, and the results were shown in the following Tables 5 and 6.

Comparative Example 9

A metalizing film having the same structure as that in Example 33 was manufactured under the same conditions as those in Example 33 except for using a PET film (50 μm, H34, Kolon Industries Co.) as a base film, thereby manufacturing a metalizing film including a metal deposition layer having a thickness of 52 nm, a print layer having a thickness of 2.0 μm, a protective layer having a thickness of 0.4 μm, and a anti-curling layer having a thickness of 1.0 μm.

The obtained metalizing film was evaluated by the above-mentioned methods, and the results were shown in the following Tables 5 and 6.

Comparative Example 10

A metalizing film having the same structure as that of Example 33 was manufactured by the same method as in Example 33 except that an anti-curling layer was not formed, thereby manufacturing a metalizing film including a metal deposition layer having a thickness of 52 nm, a print layer having a thickness of 2.0 μm, and a protective layer having a thickness of 0.4 μm.

The obtained metalizing film was evaluated by the above-mentioned methods, and the results were shown in the following Tables 5 and 6.

TABLE 5

| | Base film | | Metalizing film | | | | |
|---|---|---|---|---|---|---|---|
| | Heat shrinkage rate (TD direction, %) | Haze (%) | Analysis by thermal stress tester | | | Heat shrinkage rate (TD direction, %) | Total transmittance (%) |
| | | | $T_s$ (° C.) | $T_{(Smax)}$ (° C.) | $S_{max}$ (kg/mm²) | | |
| Example 33 | 77.4 | 5.3 | 82.3 | 91.3 | 1.23 | 77.2 | 0.20 |
| Example 34 | 43.0 | 8.6 | 92.4 | 108.7 | 0.63 | 42.0 | 0.15 |
| Example 35 | 78.7 | 0.4 | 70.4 | 87.3 | 1.67 | 78.0 | 0.23 |
| Example 36 | 78.5 | 4.3 | 88.2 | 99.7 | 0.67 | 75.3 | 0.20 |
| Example 37 | 77.4 | 5.3 | 83.3 | 91.7 | 1.26 | 77.1 | 0.28 |
| Example 38 | 77.7 | 5.1 | 82.4 | 91.6 | 1.24 | 77.5 | 0.13 |
| Example 39 | 77.3 | 5.2 | 82.3 | 91.5 | 1.23 | 77.1 | 0.19 |
| Example 40 | 77.4 | 5.3 | 82.4 | 91.4 | 1.24 | 77.3 | 0.21 |
| Example 41 | 77.4 | 5.1 | 82.4 | 91.3 | 1.23 | 77.2 | 0.20 |
| Example 42 | 77.3 | 5.0 | 82.3 | 91.3 | 1.25 | 77.1 | 0.21 |
| Example 43 | 77.3 | 5.2 | 82.4 | 91.4 | 1.26 | 77.2 | 0.20 |
| Example 44 | 77.4 | 5.3 | 82.2 | 91.3 | 1.23 | 77.2 | 0.20 |
| Example 45 | 74.9 | 5.9 | 83.2 | 93.5 | 1.18 | 71.7 | 0.20 |
| Example 46 | 70.5 | 6.2 | 84.5 | 95.7 | 1.12 | 68.2 | 0.20 |
| Example 47 | 77.4 | 5.2 | 82.2 | 90.9 | 1.23 | 77.1 | 0.21 |
| Example 48 | 77.4 | 5.3 | 82.0 | 90.9 | 1.28 | 77.2 | 11.31 |
| Example 49 | 77.2 | 5.2 | 82.1 | 91.0 | 1.24 | 76.9 | 0.22 |
| Example 50 | 77.4 | 5.3 | 82.2 | 91.3 | 1.24 | 77.1 | 0.20 |
| Example 51 | 77.3 | 5.4 | 82.3 | 91.3 | 1.23 | 77.2 | 0.19 |
| Comparative Example 9 | 1.6 | 2.3 | 231.7 | 272.9 | 0.11 | 1.4 | 0.19 |
| Comparative Example 10 | 77.3 | 5.3 | 82.4 | 91.3 | 1.22 | 77.0 | 9.23 |

TABLE 6

| | Metalizing film | | | | |
|---|---|---|---|---|---|
| | curl degree evaluation (mm) (values measured at four edges) | Curl characteristic value (mm) | Printing adhesion property | Adhesion property of label (%) | Separation property of label (%) |
| Example 33 | 1.2/0.8/0.4/0.4 | 1.2 | ○ | 99.9 | 99.9 |
| Example 34 | 2.0/1.3/1.0/0.5 | 2.0 | ○ | 100.0 | 99.8 |

TABLE 6-continued

| | Metalizing film | | | | |
|---|---|---|---|---|---|
| | curl degree evaluation (mm) (values measured at four edges) | Curl characteristic value (mm) | Printing adhesion property | Adhesion property of label (%) | Separation property of label (%) |
| Example 35 | 0.7/0.6/1.6/1.4 | 1.6 | ○ | 100.0 | 100.0 |
| Example 36 | 0.6/1.3/0.2/1.4 | 1.4 | ○ | 99.9 | 100.0 |
| Example 37 | 1.1/1.0/1.2/1.1 | 1.2 | ○ | 100.0 | 100.0 |
| Example 38 | 1.3/0.7/0.8/1.2 | 1.3 | ○ | 99.9 | 100.0 |
| Example 39 | 1.5/1.2/1.4/0.8 | 1.5 | ○ | 100.0 | 100.0 |
| Example 40 | 1.6/0.4/1.2/1.3 | 1.6 | ○ | 100.0 | 99.9 |
| Example 41 | 1.2/1.5/1.7/1.1 | 1.7 | ○ | 100.0 | 99.9 |
| Example 42 | 2.1/1.8/1.7/2.3 | 2.3 | ○ | 99.9 | 100.0 |
| Example 43 | 1.2/1.5/1.3/1.6 | 1.6 | ○ | 100.0 | 100.0 |
| Example 44 | 1.3/1.7/1.2/1.4 | 1.7 | ○ | 100.0 | 99.9 |
| Example 45 | 1.8/2.2/1.8/1.2 | 1.8 | ○ | 100.0 | 99.9 |
| Example 46 | 1.7/2.8/3.0/0.8 | 3.0 | ○ | 100.0 | 100.0 |
| Example 47 | 1.1/1.3/2.1/0.6 | 2.1 | Δ | 100.0 | 100.0 |
| Example 48 | 3.9/3.8/4.5/3.1 | 3.1 | ○ | 92.1 | 100.0 |
| Example 49 | 2.3/3.2/1.8/4.1 | 4.1 | ○ | 99.9 | 85.1 |
| Example 50 | 2.2/3.1/4.7/3.5 | 4.7 | ○ | 95.1 | 99.7 |
| Example 51 | −2.7/−3.5/−2.4/−3.3 | −3.5 | ○ | 93.9 | 99.9 |
| Comparative Example 9 | 0.4/1.7/1.3/1.1 | 1.7 | ○ | 99.8 | 2.2 |
| Comparative Example 10 | −5.3/−6.7/−4.7/−4.9 | −6.7 | ○ | 87.9 | 99.8 |

It may be appreciated from the results shown in Table 5 and 6 that in the metalizing films of the Examples according to the present invention, the shrinkage stress, the shrinkability, the total transmittance, and the printing adhesion property were excellent, and the adhesion property and separation property of the label were high, such that the metalizing films may replace a generally used paper label, and the label may be removed by an eco-friendly means. Particularly, among the Examples, in the case of Examples 45 and 46 in which the stretching was performed in both of the machine direction and the transverse direction of the film, the adhesion property and separation property of the label were excellent, such that the process applicability of the label was excellent, and it may be relatively easy to separate the label peeled off and detached from the bottle and the bottle from each other, as compared to other Examples. Particularly, in a floating type bottle washer of introducing water into the bottle washer to float a label on water surface by using pressure of water and collecting a separated label using a hook at an upper portion of the bottle washer, in the cases of other Examples in which the stretching was performed only in the transverse direction of the film, a label curling phenomenon in the maximum shrinkage direction of the film was generated, such that at the time of floating the label to the upper portion of the bottle washer, pressure or a flux of water needs to be increased, but in the cases of Examples 45 and 46, at the time of separating the label from the bottle, a bidirectional shrinkage phenomenon was generated, which alleviates the label curling phenomenon, such that it may be easy to float the label to the upper portion of the bottle washer to separate the label from the bottle, as compared to other Examples. Therefore, the cases of Examples 45 and 46 were advantageous in view of reduction of water and energy consumption.

Meanwhile, it may be appreciated that in Comparative Example 9 in which the heat-shrinkable polyester-based base film was not used, separation of the label in simple hot water was substantially impossible.

Further, it may be confirmed that in the case in which an anti-curling layer was not present as in Comparative Example 10, the adhesion property of the label was deteriorated.

In addition, it may be confirmed from the results in Examples 48 to 51 that in view of improving the adhesion property of the label, preferably, the thicknesses of the metal deposition layer and the print layer need to be controlled.

In addition, it may be confirmed that in the case in which the thickness of the metal deposition layer was thin as in Example 48, the total transmittance of the heat-shrinkable metalizing film was high, such that at the time of applying a print label, which was a final product, to a colored bottle, a color of the bottle was reflected, which may deteriorate a printing effect and visibility of the printed pattern, thereby deteriorating an aesthetic property of the advertisement. Therefore, it may be confirmed that the thickness of the metal deposition layer needs to be controlled in consideration of visibility.

Further, in the case in which a initial shrinkage temperature was high and a maximum shrinkage stress was low as in Example 49, at the time of removing the print label from the bottle, the print label was attached to the bottle in some cases, such that at the time of removing the print label, several processes should be performed, thereby deteriorating economic efficiency. Therefore, it may be confirmed that preferably, the initial shrinkage temperature, the maximum shrinkage stress, and the like, need to be controlled.

Furthermore, in the case of Example 47 to which the protective layer was not applied, there were no problems in the adhesion property and separation property, but the metal deposition layer and the print layer of the print label were separated from each other at the time of separating the print label, such that the print label separating material may contaminate water, which may cause secondary contamination of the bottle. As a result, additional washing of the bottle should be performed. There was no problem in the overall processability, but since the washing process of the bottle should be added after separating the print label, at the time of applying the print label, process cost may be increased.

The invention claimed is:
1. A polyester-based metalizing film comprising:
   a heat-shrinkable polyester-based film base, said base having a first surface and a second surface which is opposite to the first surface;

a metal deposition layer formed on the first surface of the base, said metal deposition layer having an optical density of 1.0 to 3.0;
a print layer formed on the metal deposition layer; and
an anti-curling layer formed on and in contact with the second surface of the base, said anti-curling layer having 0.1 to 5 µm thickness,
wherein the polyester-based metalizing film has a curl characteristic value of 5.0 mm or less;
wherein the polyester-based metalizing film has a total transmittance of 0.1 to 5.0%; and
wherein the curl characteristic value is defined as follows:
a heat-shrinkable polyester metalizing film specimen, placed on a first flat surface, is subject to a first cutting at a first direction to form a first cut of 20 cm length and to a second cutting at a second direction which is vertical to the first direction to form a second cut of 20 cm length so as to form four equal 10 cm length cuts, wherein the center of the first cut and the center of the second meet each other; the specimen with four equal length cuts is lift from the first flat surface; the specimen then is placed on a second flat surface with the metal deposition layer faces upward and heights of the four cut edges from the second flat surface are measure; then the specimen is placed on the second flat surface with the metal deposition layer faces downward and heights of the four cut edges from the second flat surface are measured; and the largest value of the measured heights is defined as the curl characteristic value, and
wherein the anti-curling layer is a layer made of a composition containing:
at least one resin selected from the group consisting of a polyamide resin, an acrylic resin, a polyurethane resin, a polyvinyl chloride-based resin, a ketone resin, chlorinated rubber, a vinyl acetate resin, and an ethylene-vinyl acetate copolymer;
at least one solvent selected from the group consisting of an aromatic hydrocarbon-based solvent, a ketone-based solvent, an acetate-based solvent, and a chlorine-based solvent;
a white pigment; and
at least one additive selected from the group consisting of an anti-precipitator, a thickening agent, a color-separation preventing agent, and a pigment dispersant.

2. The polyester-based metalizing film of claim 1, further comprising a protective layer formed on the print layer.

3. The polyester-based metalizing film of claim 2, further comprising a primer layer formed between the metal deposition layer and the print layer.

4. A polyester-based metalizing film, comprising:
a heat-shrinkable polyester-based film base, said base having a first surface and a second surface which is opposite to the first surface;
a first metal layer formed on the first surface of the base, said metal deposition layer having an optical density of 1.0 to 3.0;
a print layer formed on the metal deposition layer;
a second metal layer formed on the second surface of the base; and
an anti-curling layer formed on the second metal layer, said anti-curling layer having 0.1 to 5 µm thickness,
wherein the polyester-based metalizing film has a curl characteristic value of 5.0 mm or less;
wherein the polyester-based metalizing film has a total transmittance of 0.1 to 5.0%; and
wherein the curl characteristic value is defined as follows:
a heat-shrinkable polyester metalizing film specimen, placed on a first flat surface, is subject to a first cutting at a first direction to form a first cut of 20 cm length and to a second cutting at a second direction which is vertical to the first direction to form a second cut of 20 cm length so as to form four equal 10 cm length cuts, wherein the center of the first cut and the center of the second meet each other; the specimen with four equal length cuts is lift from the first flat surface; the specimen then is placed on a second flat surface with the metal deposition layer faces upward and heights of the four cut edges from the second flat surface are measure; then the specimen is placed on the second flat surface with the metal deposition layer faces downward and heights of the four cut edges from the second flat surface are measured; and the largest value of the measured heights is defined as the curl characteristic value.

5. The polyester-based metalizing film of claim 1, wherein it has opacity (%) of 80% or more.

6. The polyester-based metalizing film of claim 5, wherein it has opacity (%) of 90 to 100%.

7. The polyester-based metalizing film of claim 1, wherein the curl characteristic value is 2.0 mm or less.

8. The polyester-based metalizing film of claim 4, wherein the second metal layer has an optical density of 0.2 to 0.8.

9. The polyester-based metalizing film of claim 1, wherein the anti-curling layer is an embossing layer formed by physically or chemically treating a surface of the heat-shrinkable polyester-based film base or a white pigment coating layer.

10. The polyester-based metalizing film of claim 1, wherein the protective layer is a resin layer made of any one selected from the group consisting of copolyester, an acrylic copolymer, a styrene copolymer, a methacrylate copolymer, polystyrene, vinyl acetate, polyamide, alkylacrylate, ureaformaldehyde, epoxydized soybean oil, an ethylene-vinyl acetate copolymer, beef tallow-based oleamide, polyethylene glycol distearate, polyvinylidene, a polyolefin-based copolymer, a urethane resin, and a vinyl-based resin, and a mixture thereof.

11. The polyester-based metalizing film of claim 1, wherein the heat-shrinkable polyester-based film base contains a polyester-based resin including a butylene terephthalate repeating unit.

12. The polyester-based metalizing film of claim 11, wherein the heat-shrinkable polyester-based film base contains at least one copolyester, said copolyester being obtained from a dicarboxylic acid component selected from the group consisting of terephthalic acid, oxalic acid, malonic acid, succinic acid, adipic acid, suberic acid, azelaic acid, sebacic acid, phthalic acid, isophthalic acid, naphthalene dicarboxylic acid, and diphenyl ether carboxylic acid, and a diol component selected from the group consisting of ethylene glycol, neopentyl glycol, propylene glycol, trimethylene glycol, tetramethylene glycol, hexamethylene glycol, diethylene glycol, polyalkylene glycol, and 1,4-cyclohexane dimethanol.

13. The polyester-based metalizing film of claim 12, wherein the dicarboxylic acid component comprises a terephthalic acid and the diol component comprises ethylene glycol, and wherein a ratio of the terephthalic acid, based on the total amount of the dicarboxylic acid components, is 80 mole % or more, and a ratio of other diol components than the ethylene glycol, based on the total amount of the diol components, is 12 to 24 mole %.

14. The polyester-based metalizing film of claim 1, wherein the heat-shrinkable polyester-based film base is a uniaxially oriented heat-shrinkable polyester film base or a biaxially oriented heat-shrinkable polyester film base.

15. The polyester-based metalizing film of claim 1, wherein, the polyester-based metalizing film which is treated with hot water at 90° C. for 10 seconds, has a shrinkage rate in a maximum shrinkage direction of 40 to 80%.

16. The polyester-based metalizing film of claim 1, which has an initial shrinkage temperature in a maximum shrinkage direction of 68 to 94° C., a maximum shrinkage temperature of 80 to 110° C., and a maximum shrinkage stress of 0.60 to 1.80 kg/mm$^2$.

17. The polyester-based metalizing film of claim 1, wherein the heat-shrinkable polyester-based film base has a haze of 0.3 to 10.0%.

18. A label-attached bottle comprising the polyester-based metalizing film of claim 1.

19. The label-attached bottle of claim 18, wherein the polyester-based metalizing film is removed by immersing the bottle in hot water.

20. A label-attached bottle comprising the polyester-based metalizing film of claim 4.

21. The label-attached bottle of claim 20, wherein the polyester-based metalizing film is removed by immersing the bottle in hot water.

\* \* \* \* \*